United States Patent
Jung et al.

(10) Patent No.: US 10,951,199 B1
(45) Date of Patent: Mar. 16, 2021

(54) TIMING DATA ACQUISITION DEVICE THAT SUPPORTS EFFICIENT SET-UP AND HOLD TIME DETERMINATION IN SYNCHRONOUS SYSTEMS

(71) Applicant: Samsung Electronics Co., Ltd., Suwon-si (KR)

(72) Inventors: Yeonho Jung, Suwon-si (KR); Mijoung Kim, Hwaseong-si (KR); Jekyun Ryu, Seoul (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/897,939

(22) Filed: Jun. 10, 2020

(30) Foreign Application Priority Data

Nov. 5, 2019 (KR) .................. 10-2019-0140445

(51) Int. Cl.
| | |
|---|---|
| *H03K 5/133* | (2014.01) |
| *H03K 5/156* | (2006.01) |
| *H03M 1/50* | (2006.01) |
| *H03L 7/00* | (2006.01) |
| *G01R 31/317* | (2006.01) |
| *H03K 3/03* | (2006.01) |
| *H03K 5/00* | (2006.01) |

(52) U.S. Cl.
CPC ........... *H03K 3/0315* (2013.01); *H03K 5/133* (2013.01); *H03K 2005/00234* (2013.01)

(58) Field of Classification Search
None
See application file for complete search history.

(56) References Cited

U.S. PATENT DOCUMENTS

| | | | |
|---|---|---|---|
| 7,126,400 B2 | 10/2006 | Tamura | |
| 7,782,242 B2 | 8/2010 | Rivoir | |
| 7,944,229 B2* | 5/2011 | Joshi | ................ G01R 31/31726 324/762.01 |
| 8,164,318 B2* | 4/2012 | Sasaki | .................... H03K 5/133 323/283 |
| 8,471,754 B2 | 6/2013 | Yamamoto et al. | |
| 8,736,338 B2 | 5/2014 | Cao et al. | |
| 8,825,424 B2 | 9/2014 | Rivoir | |

(Continued)

FOREIGN PATENT DOCUMENTS

KR    10-2008-0004774 A    1/2008

*Primary Examiner* — Kenneth B Wells
(74) *Attorney, Agent, or Firm* — Myers Bigel, P.A.

(57) ABSTRACT

A timing data acquisition device includes a data signal generator, which is configured to generate a plurality of data signals by repeatedly delaying a first periodic timing signal in increments of a first delay value, and a clock signal generator, which is configured to generate a plurality of clock signals by repeatedly delaying a second periodic timing signal in increments of a second delay value exceeding the first delay value. A plurality of D flip-flops are also provided. The flip-flops have: (i) data terminals responsive to respective ones of the plurality of data signals, and (ii) clock terminals responsive to respective ones of the plurality of clock signals. The flip flops are configured to generate a plurality of latched output signals having values that collectively encode at least one of a set-up time and a hold-time of a semiconductor device by identifying a pass/fail boundary point between the delays associated with the plurality of data signals and the delays associated with the plurality of clock signals.

9 Claims, 15 Drawing Sheets

(56) References Cited

U.S. PATENT DOCUMENTS

| | | | |
|---|---|---|---|
| 8,878,715 B2* | 11/2014 | Miyashita | G06F 1/025 |
| | | | 341/166 |
| 8,901,819 B2 | 12/2014 | Raychowdhury et al. | |
| 8,981,974 B2* | 3/2015 | Chaivipas | H03M 1/0624 |
| | | | 341/118 |
| 9,176,479 B2* | 11/2015 | Hsieh | H03L 7/085 |
| 9,490,831 B2* | 11/2016 | Kim | H03L 7/085 |
| 9,720,380 B2* | 8/2017 | Zhou | G04F 10/005 |
| 9,722,625 B2* | 8/2017 | Kawano | H03M 1/502 |
| 9,977,845 B2 | 5/2018 | Kim | |
| 9,984,732 B2* | 5/2018 | Seomun | G11C 7/222 |
| 10,054,632 B2 | 8/2018 | Seong | |
| 10,230,383 B2* | 3/2019 | Yan | H03M 1/502 |
| 10,840,896 B2* | 11/2020 | Chae | G01R 31/31721 |
| 2008/0030247 A1 | 2/2008 | Haerle et al. | |

\* cited by examiner hold 1

TIMING DATA ACQUISITION DEVICE THAT SUPPORTS EFFICIENT SET-UP AND HOLD TIME DETERMINATION IN SYNCHRONOUS SYSTEMS

REFERENCE TO PRIORITY APPLICATION

This application claims the benefit of Korean Patent Application No. 10-2019-0140445, filed Nov. 5, 2019, the disclosure of which is hereby incorporated herein by reference.

BACKGROUND

The present inventive concept relates to synchronous devices having tight timing requirements.

Semiconductor devices are tested for AC characteristics at the package level and are shipped for product assembly. As the manufacturing process of the semiconductor device is miniaturized, it is required to secure timing data in picoseconds to improve product performance. However, it is very difficult for an existing timing data acquisition device to collect accurate timing data due to an error in an on-chip variation (OCV) factor value, set-up time noise of the D flip-flop itself, or the like.

SUMMARY

An aspect of the present inventive concept is to provide a timing data acquisition device capable of collecting more accurate timing data on a picosecond scale.

According to some embodiments of the inventive concept, a timing data acquisition device is provided, which contains a data signal generator and a clock signal generator. The data signal generator is configured to generate a plurality of data signals by repeatedly delaying a first periodic timing signal, which is derived from an external clock signal, in increments of a first delay value. The clock signal generator is configured to generate a plurality of clock signals by repeatedly delaying a second periodic timing signal, which is derived from the external clock signal, in increments of a second delay value exceeding the first delay value. In addition, a plurality of D flip-flops are provided, which are electrically coupled to the data signal generator and clock signal generator. This plurality of D flip-flops is configured so that data terminals of the flip-flops are responsive to respective ones of the plurality of data signals, and clock terminals of the flip-flops are responsive to respective ones of the plurality of clock signals. In addition, the plurality of D flip flops are configured to generate a plurality of latched output signals having values that collectively encode at least one of a set-up time and a hold-time of a semiconductor device by identifying a pass/fail boundary point between the delays associated with the plurality of data signals and the delays associated with the plurality of clock signals.

According to some of these embodiments of the invention, the set-up time of the semiconductor device is a function of a difference in delay between a data signal and a corresponding clock signal received by a D flip-flop associated with the pass/fail boundary point. Likewise, the hold time of the semiconductor device is a function of a difference in delay between a data signal and a corresponding clock signal received by a D flip-flop associated with the pass/fail boundary point.

According to additional embodiments of the invention, the data signal generator is configured to include a cascaded chain of equivalent data signal delay units, and each of the plurality of data signals is generated by a respective node within the cascaded chain. The data signal generator may further include a mode selector having an output electrically coupled to an input of the first cascaded chain. This mode selector may be configured to support a pair of modes, including a first mode that supports determination of a logic 0 set-up time associated with the semiconductor device, and a second mode that supports determination of a logic 1 set-up time associated with the semiconductor device.

According to further embodiments of the invention, the data signal generator is configured to support a ring oscillator mode of operation that utilizes one of the plurality of data signals as a ring oscillator feedback signal. Likewise, the clock signal generator may also be configured to support a ring oscillator mode of operation that utilizes one of the plurality of clock signals as a ring oscillator feedback signal. Furthermore, the clock signal generator may be configured to block the external clock signal from influencing the second periodic timing signal during the ring oscillator mode of operation.

According to still further embodiments of the inventive concept, an integrated circuit device is provided, which includes data signal and clock signal generators, and a plurality of latches, which are responsive to signals generated by the data signal and clock signal generators. In particular, the data signal generator is configured to generate a plurality of periodic data signals that are out-of-phase relative to each other, whereas the clock signal generator is configured to generate a plurality of periodic clock signals that are out-of-phase relative to each other (but have the same duty cycles as the periodic data signals). The plurality of latches are configured so that their data terminals are responsive to respective ones of the plurality of data signals, and their clock terminals are responsive to respective ones of the plurality of clock signals. The plurality of latches are also configured to generate a plurality of latched output signals having values that collectively encode at least one of a set-up time and a hold-time of the latches by identifying a pass/fail boundary point between the delays associated with the plurality of data signals and the delays associated with the plurality of clock signals. The data signal generator may also be configured to support a ring oscillator mode of operation that utilizes one of the plurality of data signals as a ring oscillator feedback signal.

According to another embodiment of the inventive concept, a timing data acquisition device includes: (i) a data signal generator configured to repeatedly delay an external clock signal, according to a first delay value, to generate a plurality of data signals, (ii) a clock signal generator configured to repeatedly delay the external clock signal according to a second delay value, greater than the first delay value, to generate a plurality of clock signals, and (iii) a plurality of D flip-flops configured to receive the plurality of data signals and the plurality of clock signals and generate predetermined output signals. The plurality of output signals generated by the D flip-flops enable the determination of a critical point amongst these output signals, from which a measurement of at least one of a set-up time and a hold time of a semiconductor device can be determined.

According to another aspect of the inventive concept, a timing data acquisition device includes: (i) a data signal generator having a plurality of first inverter chains therein that delay an external clock signal to thereby generate a plurality of data signals, (ii) a clock signal generator having a plurality of second inverter chains therein that delay the external clock signal to thereby generate a plurality of clock signals, (iii) a plurality of D flip-flops having a data input terminal connected to a level-down shifter and a clock input terminal connected to a level-up shifter, (iv) an input level-up shifter connected to an input terminal of the external clock signal of the data signal generator, and (v) an input level-down shifter connected to an input terminal of the external clock signal of the clock signal generator.

According to another embodiment of the inventive concept, a timing data acquisition device includes a first input multiplexer selectively outputting one of a first signal and a second signal, a second input multiplexer selectively outputting one of the second signal and the third signal, a data signal generator configured to repeatedly delay an output signal of the first input multiplexer according to a first delay value to thereby generate a plurality of data signals, a clock signal generator configured to repeatedly delay an output signal of the second input multiplexer according to a second delay value (greater than the first delay value) to thereby generate a plurality of clock signals, and a plurality of D flip-flops receiving the plurality of data signals and the plurality of clock signals and generating predetermined output values. A critical point at which the output values of the plurality of D flip-flops change is then detected, to measure a clock-to-delay of a semiconductor device.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
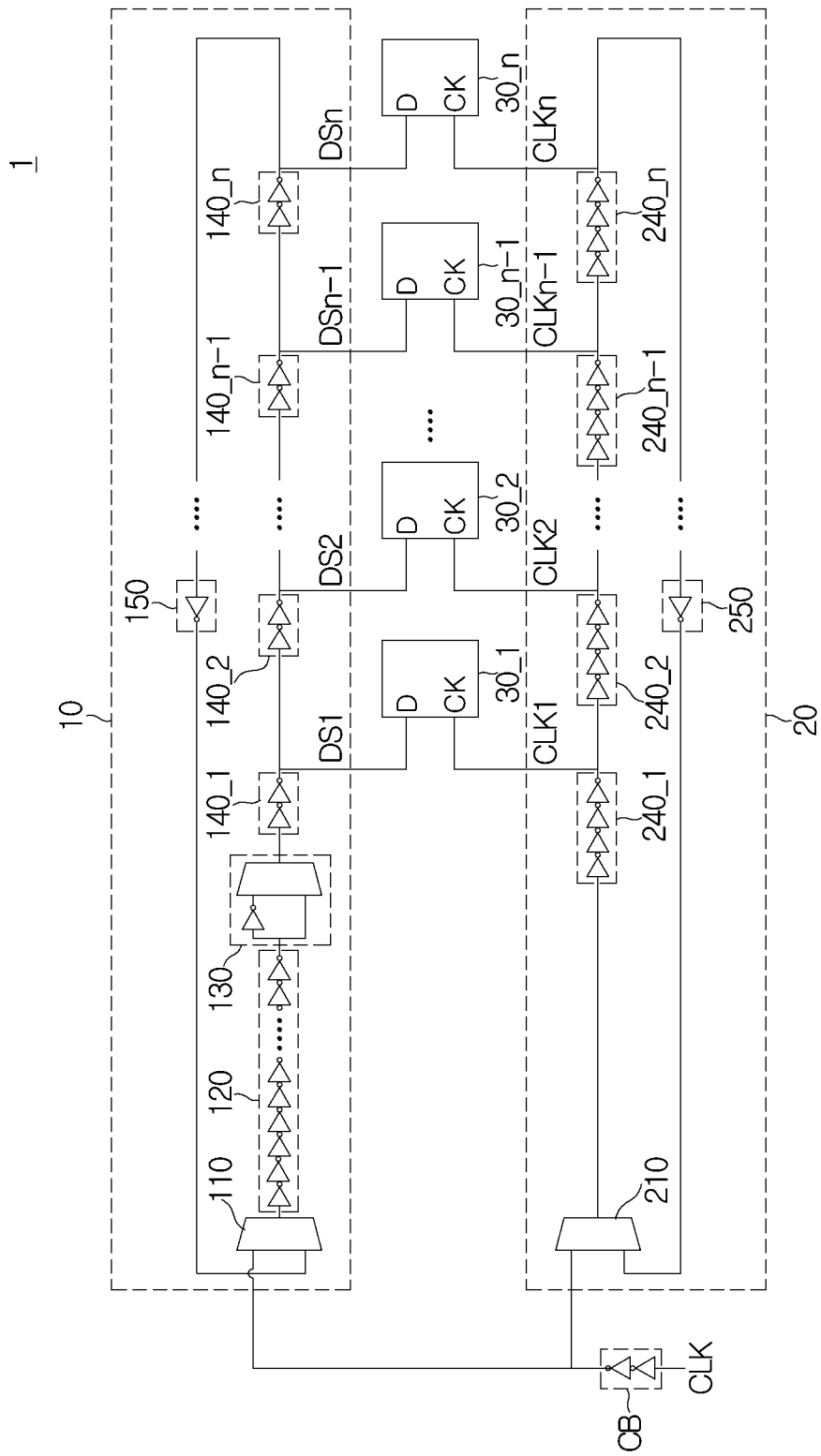
FIG. 1 is a circuit diagram illustrating a timing data acquisition device according to an example embodiment.

Hereinafter, example embodiments will be described in detail with reference to the accompanying drawings. Like reference numerals are used to designate like elements, and duplicate descriptions of like elements will be omitted.

FIG. 1 is a circuit diagram illustrating a timing data acquisition device according to an example embodiment. A timing data acquisition device 1 may be used to verify the semiconductor design of an intellectual property (IP) block. For example, the timing data acquisition device 1 may be used to collect timing data which is detected inside a semiconductor chip, such as an application-specific integrated circuit (ASIC), a system on chip (SoC), or the like, by measuring a timing margin between a data signal and a clock signal or between an internal signal and a clock signal, outside of the semiconductor chip.

Referring to FIG. 1, the timing data acquisition device 1 may include a data signal generator 10, a clock signal generator 20, and a plurality of D flip-flops 30_1 to 30_$n$. The data signal generator 10 may receive an external clock signal CLK through a clock buffer CB, generate first to nth data signals DS1 to DSn as oscillation signals, and provide the generated first to nth data signals DS1 to DSn to the first to nth D flip-flops 30_1 to 30_$n$, respectively. In an example embodiment, the first to nth data signals DS1 to DSn may be sequentially delayed signals. For example, the second data signal DS2 may be a signal obtained by delaying the first data signal DS1 by a first time. The nth data signal DSn may be a signal obtained by delaying the n−1th data signal DSn−1 by the first time. As a result, the nth data signal DSn may be a signal obtained by delaying the first data signal DS1 by a total amount equivalent to a product of the first time and n (i.e., first time×n).

The data signal generator 10 may include a multiplexer 110, an offset generator 120, a mode selector 130, first to nth data signal delay units 140_1 to 140_$n$, and a first oscillating inverting unit 150. The multiplexer 110 may receive the external clock signal CLK and an inverted signal of the nth data signal DSn fed back through the first oscillating inverting unit 150, and may selectively output any one of the received signals. The first oscillating inverting unit 150 may include 2n−1 inverters (where n is a natural number), and may be disposed in a feedback loop of the data signal generator 10, which is a data path to be used to generate an oscillation signal.

The offset generator 120 may include a plurality of inverters connected between an output terminal of the multiplexer 110 and an input terminal of the mode selector 130, and may add an offset delay for distinguishing signals from each other to output signals of the multiplexer 110.

The mode selector 130 may determine the measurement mode of the timing data acquisition device 1. For example, the timing data acquisition device 1 may operate, under the control of the mode selector 130, in one of a first set-up time measurement mode for measuring set-up time for a data signal having an initial value '0' (or logic low), and a second set-up time measurement mode for measuring set-up time for a data signal having an initial value '1' (or logic high). In addition, the timing data acquisition device 1 may, under the control of the mode selector 130, operate in one of a first hold time measurement mode for measuring a hold time for a data signal having an initial value '0' (or logic low), and a second hold time measurement mode for measuring a hold time for a data signal having an initial value '1' (or logic high). As will be understood by those skilled in the art, a "set-up" time may be equivalent to the amount of time that data at a synchronous input (e.g., "D") must be stable before an active edge of a corresponding clock (CLK), whereas a "hold" time may be equivalent to the amount of time that the data (at the synchronous input) must be stable after the active edge of the clock.

The mode selector 130 may include a multiplexer (MUX) and an inverter. The multiplexer MUX may selectively output one of an output signal of the offset generator 120 and a signal provided by inverting the output signal by an inverter 133, to determine a measurement mode of the timing data acquisition device 1. For example, when the multiplexer MUX outputs an output signal of the offset generator 120, the timing data acquisition device 1 may operate in a first set-up time measurement mode. In addition, when the multiplexer MUX outputs the signal provided by inverting the output signal of the offset generator 120, the timing data acquisition device 1 may operate in a second set-up time measurement mode.

The first to nth data signal delay units 140_1 to 140_n continuously add a predetermined delay to the output signal of the mode selector 130 to generate the first to nth data signals DS1 to DSn and transmit the first to nth data signals DS1 to DSn to data input terminals D of the first to nth D flip-flops 30_1 to 30_n, respectively. For example, the first data signal delay unit 140_1 may generate a first data signal DS1 by adding a delay of a first time to the output signal of the mode selector 130, and may transfer the generated first data signal DS1 to the data input terminal D of the first D flip-flop 30_1. In addition, the second data signal delay unit 140_2 may generate a second data signal DS2 by adding a delay of a first time to the first data signal DS1 and may transfer the generated second data signal DS2 to the data input terminal D of the second D flip-flop 30_2. In this case, the second data signal DS2 may be a signal in which a delay of the first time multiplied by two (2) is added to the output signal of the mode selector 130. Similarly, the nth data signal delay unit 140_n may generate the nth data signal DSn by adding a delay of the first time to the nth data signal DSn−1 to generate the nth data signal DSn and may transfer the generated nth data signal DSn to the data input terminal D of the nth D flip-flop 30_n. In this case, the nth data signal DSn may be a signal in which a delay of the first time multiplied by n is added to the output signal of the mode selector 130.

Each of the first to nth data signal delay units 140_1 to 140_n may include an inverter chain to add a predetermined delay to the output signal of the mode selector 130. In an example embodiment, each of the first to nth data signal delay units 140_1 to 140_n may include 2n inverters (where n is a natural number). For example, each of the first to nth data signal delay units 140_1 to 140_n may include two inverters.

The nth data signal DSn output from the nth data signal delay unit 140_n may be fed back to the input terminal of the multiplexer 110 through the first oscillating inverting unit 150 to generate an oscillation signal. In addition, the multiplexer 110 may output an inverted signal (i.e., inverted version of the nth data signal DSn), which is fed back through the first oscillating inverting unit 150 to thereby enable the function of a ring oscillator based on a real path. In this case, the frequency of the oscillation signal generated by the data signal generator 10 is measured at the output terminal of the multiplexer 110, thereby calculating a real delay of each inverter included in each of the first to nth data signal delay units 140_1 to 140_n.

The clock signal generator 20 may receive the external clock signal CLK through the clock buffer CB, may generate first to nth clock signals CLK1 to CLKn as oscillation signals, and may provide the generated first to nth clock signals CLK1 to CLKn to the first to nth D flip-flops 30_1 to 30_n, respectively. In an example embodiment, the first to nth clock signals CLK1 to CLKn may be sequentially delayed signals. For example, the second clock signal CLK2 may be a signal obtained by delaying the first clock signal CLK1 by the first time. In addition, the nth clock signal CLKn may be a signal obtained by delaying the n−1th clock signal CLKn−1 by the first time. As a result, the nth clock signal CLKn may be a signal obtained by delaying the first clock signal CLK1 by the first time multiplied by n.

The clock signal generator 20 may include a multiplexer 210, first to nth clock signal delay units 240_1 to 240_n, and a second oscillating inverting unit 250.

The multiplexer 210 may receive an external clock signal CLK and an inverted signal of the nth clock signal CLKn fed back through the second oscillating inverting unit 250, and may selectively output one of the received signals. The second oscillating inverting unit 250 may include 2n−1 inverters (where n is a natural number), and may be disposed in a feedback loop of the clock signal generator 20 which is a clock path to generate an oscillation signal.

The first to nth clock signal delay units 240_1 to 240_n continuously add a predetermined delay to the output signal of the multiplexer 210 to generate the first to nth clock signals CLK1 to CLKn, and may transfer the first to nth clock signals CLK1 to CLKn to clock input terminals CK of the first to nth D flip-flops 30_1 to 30_n, respectively. For example, the first clock signal delay unit 240_1 may generate a first clock signal CLK1 by adding a delay of a second time to the output signal of the multiplexer 210, and may transfer the generated first clock signal CLK1 to a clock input terminal CK of the first D flip-flop 30_1. In addition, the second clock signal delay unit 240_2 may generate a second clock signal CLK2 by adding a delay of a second time to the first clock signal CLK1 to generate a second clock signal CLK2, and may transfer the generated second clock signal CLK2 to a clock input terminal CK of the second D flip-flop 30_2. In this case, the second clock signal DS2 may be a signal in which a delay of a second time multiplied by two (2) is added to the output signal of the multiplexer 210. Similarly, the nth clock signal delay unit 240_n may generate the nth clock signal CLKn by adding a delay of a second time to the n−1th clock signal CLKn−1 and may generate the nth clock signal CLKn and may transfer the generated nth clock signal CLKn to a clock input terminal CK of the nth D flip-flop 30_n. In this case, the nth clock signal CLKn may be a signal in which a delay of the second time multiplied by n is added to the output signal of the multiplexer 210. On the other hand, the second time, which is the magnitude of the delay of each of the first to nth clock signal delay units 240_1 to 240_n, is greater than the first time that is the magnitude of the delay of each of the first to nth data signal delay units 140_1 to 140_n.

The first to nth clock signal delay units 240_1 to 240_n may be respectively implemented as an inverter chain to add a predetermined delay to the output signal of the multiplexer 210. In an example embodiment, each of the first to nth clock signal delay units 240_1 to 240_n may include 2×(n+1) inverters (where n is a natural number). For example, each of the first to nth clock signal delay units 240_1 to 240_n may include four inverters.

The nth clock signal CLKn output from the nth clock signal delay unit 240_n may be fed back to the input terminal of the multiplexer 210 through the second oscillating inverting unit 250 to generate an oscillation signal. In addition, the multiplexer 210 may output an inverted signal of the nth clock signal CLKn fed back through the second oscillating inverting unit 250 to thereby enable the function of a ring oscillator based on a real path. In this case, by measuring the frequency of the oscillation signal generated by the clock signal generator 20 at the output terminal of the multiplexer 210, real delays of respective inverters of the first to nth clock signal delay units 240_1 to 240_n may be calculated. Timing skew may be calculated by subtracting a real delay of each of the first to nth data signal delay units 140_1 to 140_n from the real delay of each of the first to nth clock signal delay units 240_1 to 240_n. For example, in the case in which each of the first to nth data signal delay units 140_1 to 140_n includes two inverters having the first delay, and each of the first to nth clock signal delay units 240_1 to 240_n includes the second delay, the timing skew may be calculated by multiplying 2, which is a difference of the number of inverters, by a value obtained by subtracting the first delay from the second delay. Hereinafter, a method of measuring set-up time will be described with reference to FIGS. 2A and 2B.

Figure 2A:
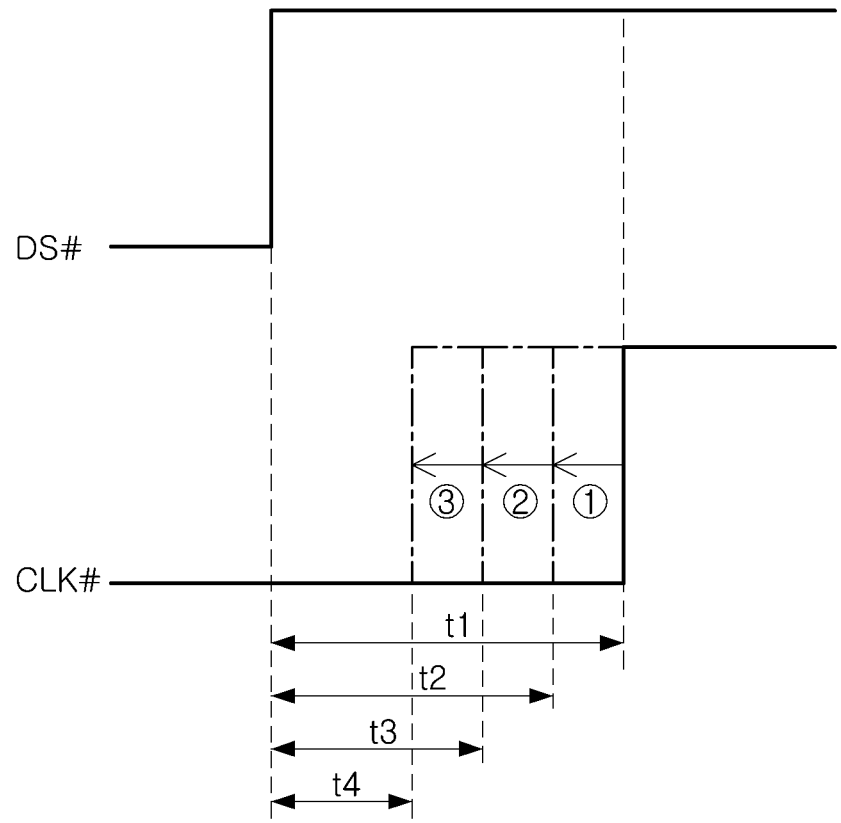
FIGS. 2A and 2B are timing diagrams illustrating a method of measuring set-up time using the timing data acquisition device of FIG. 1.
Figure 2B:
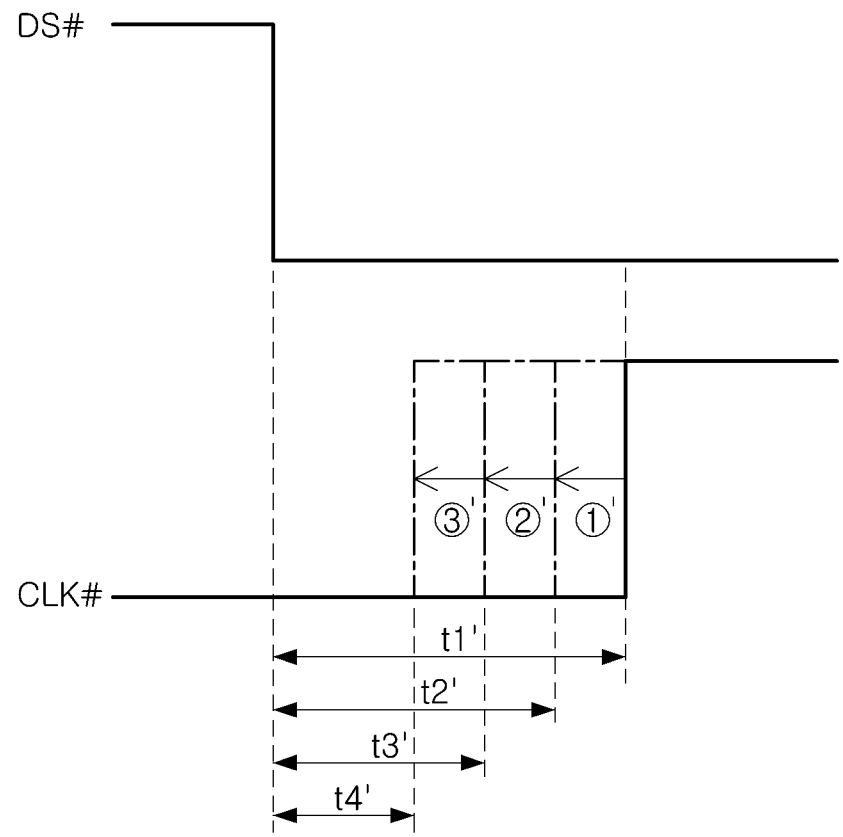

FIGS. 2A and 2B are timing diagrams illustrating a method of measuring set-up time using the timing data acquisition device of FIG. 1. FIG. 2A illustrates a method of measuring a first set-up time for a data signal having an initial value '0' (or a logic low), and FIG. 2B illustrates a method of measuring a second set-up time for a data signal having an initial value '1' (or a logic high). Referring to FIG. 2A and FIG. 1, when the value of the data signals DS1 to DSn changes from the initial value '0' to '1', to have a value of '1' as the output value of each of the first to nth D flip-flops 30_1 to 30_n, the first set-up time may be a minimum length of a time period which the value of the data signals DS1 to DSn should be maintained to have '1' in a section before a rising edge of the clock signals CLK1 to CLKn. In an example embodiment, the number of inverters included in each of the inverter chains of the clock signal generator 20 is 2×(n+1), and is more than 2 multiplied by n (i.e., 2n) which is the number of inverters included in each of the inverter chains of the data signal generator 10. Based on this design, the rising edges of the clock signals CLK1 to CLKn may be closer to the rising edges of the data signals DS1 to DSn as approaching the nth D flip-flop 30_n from the first D flip-flop 30_1. Therefore, after sequentially measuring the respective output values of the first to nth D flip-flops 30_1 to 30_n, the primary D flip-flop 30_1 to 30_n whose measured output value is not '1' may be detected/identified as a boundary point of pass/fail (i.e., a critical point). Thereafter, the first set-up time may be calculated using a difference in the number of inverters between the data path and the clock path from the first D flip-flop 30_1 to the critical point. For example, by multiplying the real delay of each inverter described above with reference to FIG. 1 by the difference between the number of inverters included in the data path and the number of inverters included in the clock path, from the first D flip-flop 30_1 to the critical point, the first set-up time may be calculated.

Referring again to the example of FIG. 2A, starting with the first D flip-flop 30_1, the output values of the respective D flip-flops 30_1 to 30_n may be sequentially measured. As the number of D flip-flops 30_1 to 30_n to be measured increases, the rising edge of a clock signal CLK# input to the D flip-flop becomes closer to the rising edge of a data signal DS# (①→②→③). As a result, the time period from the rising edge of the clock signal CLK# to the rising edge of the data signal DS# may be reduced (t1>t2>t3>t4).

When the output values of the first to third D flip-flops 30_1 to 30_3 are '1' and the output value of the fourth D flip-flop 30_4 is '0,' the fourth D flip-flop 30_4 may be detected as a critical point. In this case, the first set-up time may be calculated using the real delay of each inverter included in the timing data acquisition device 1 as described above.

Referring to FIG. 2B and FIG. 1, when the value of the data signals DS1 to DSn changes from an initial value '1' to '0,' in order for the output value of each of the first to nth D flip-flops 30_1 to 30_n to have a value of '0,' the second set-up time may be a minimum length of a time period that the value of the data signals DS1 to DSn should be maintained to have '0' in a section before the rising edge of the clock signal CLK1 to CLKn.

In an example embodiment, the number of inverters included in each of the inverter chains of the clock signal generator 20 is greater than the number of inverters included in each of the inverter chains of the data signal generator 10. Thus, the rising edge of the clock signals CLK1 to CLKn may be closer to the rising edge of the data signals DS1 to DSn, as approaching the nth D flip-flop 30_n from the first D flip-flop 30_1. Therefore, after sequentially measuring respective output values of the first to nth D flip-flops 30_1 to 30_n, the primary D flip-flop 30_1 to 30_n of which the measured output value is not '0' may be detected as the boundary point of pass/fail (i.e., a critical point). Thereafter, the second set-up time may be calculated using a difference in the number of inverters between the data path and the clock path, from the first D flip-flop 30_1 to the critical point. For example, by multiplying the real delay of each inverter described above with reference to FIG. 1 by the difference between the number of inverters included in the data path and the number of inverters included in the clock path, from the first D flip-flop 30_1 to the critical point, the second set-up time may be calculated.

Referring again to the example of FIG. 2B, the output values of the respective D flip-flops 30_1 to 30_n may be sequentially measured from the first D flip-flops 30_1. As the number of D flip-flops 30_1 to 30_n to be measured increases, the rising edge of the clock signal CLK# input to the D flip-flop may become closer to the rising edge of the data signal DS# (①'→②'→③'). As a result, the time period from the rising edge of the clock signal CLK# to the rising edge of the data signal DS# may be gradually reduced (t1'>t2'>t3'>t4').

When the output values of the first to third D flip-flops 30_1 to 30_3 are '0' and the output value of the fourth D flip-flop 30_4, is '1' the fourth D flip-flop 30_4 may be detected as a critical point. In this case, the second set-up time may be calculated using the real delay of each inverter included in the timing data acquisition device 1 as described above.

The first set-up time and the second set-up time calculated by using the method described above with reference to FIGS. 2A and 2B are actual values and may have a higher accuracy than the first set-up time and the second set-up time collected using various tools based on predefined on-chip variation (OCV) factor values. Hereinafter, a method of measuring a hold time will be described with reference to FIGS. 3A and 3B.

Figure 3A:
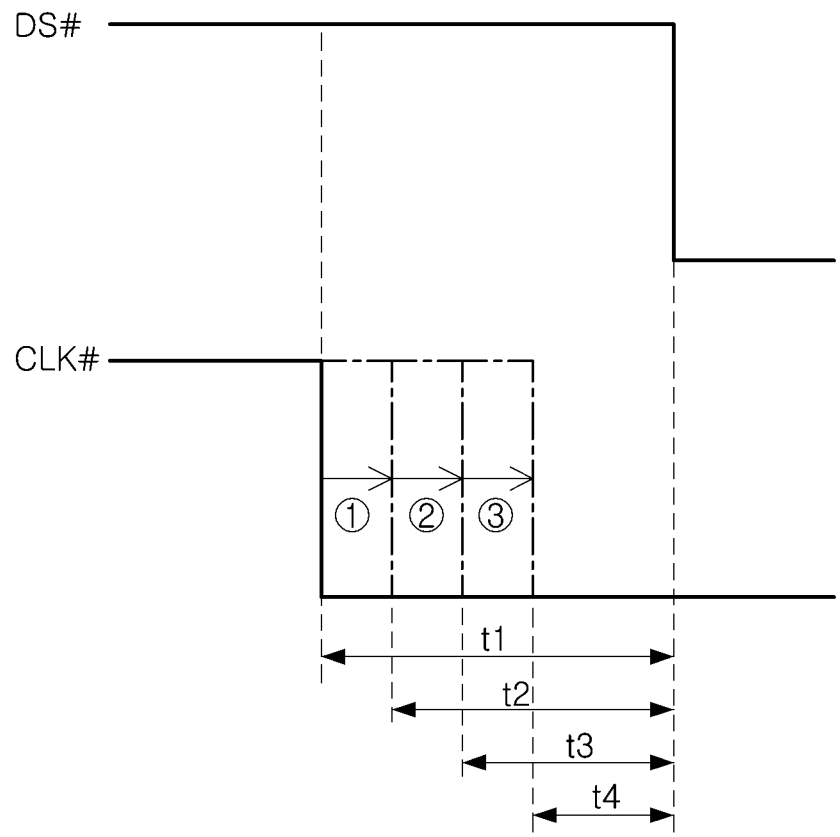
FIGS. 3A and 3B are timing diagrams illustrating a method of measuring a hold time using the timing data acquisition device of FIG. 1.
Figure 3B:
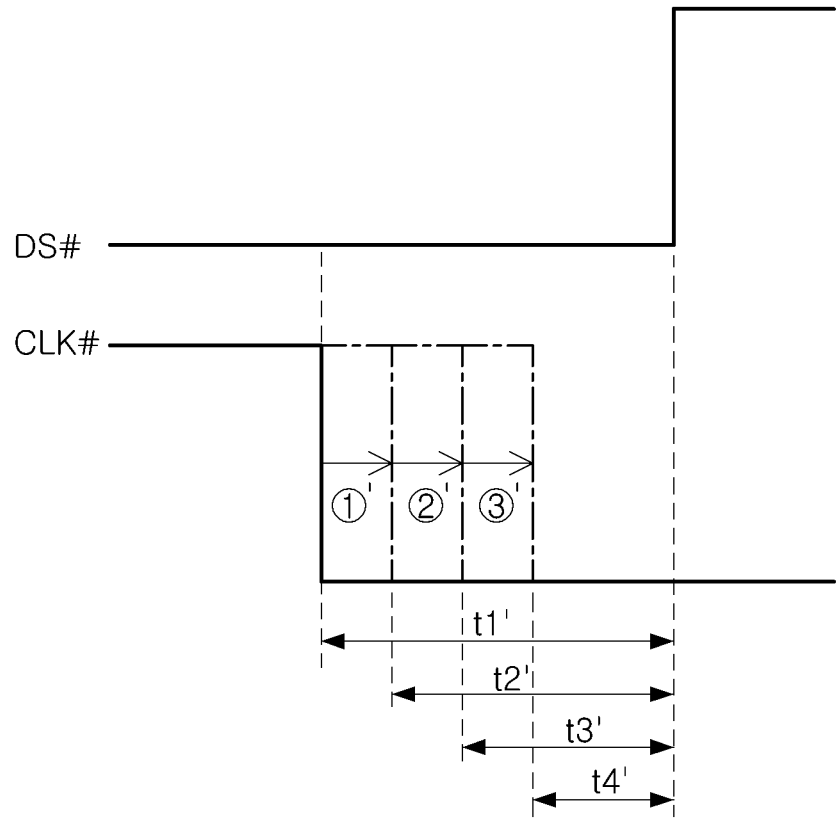

FIGS. 3A and 3B are timing diagrams illustrating a method of measuring a hold time using the timing data acquisition device of FIG. 1. FIG. 3A illustrates a method of measuring a first hold time for a data signal having an initial value '0' (or a logic low), and FIG. 3B illustrates a method of measuring a hold time for a data signal having an initial value '1' (or a logic high).

Referring to FIGS. 3A and 1, when the value of the data signal DS1 to DSn is changed from '1' to initial value '0,' in order for respective output values of the first to nth D flip-flops D flip-flops to have a value of '1,' the first hold time may be a minimum length of a time period which the value of the data signals DS1 to DSn should be maintained to have '1' in an interval after a falling edge of the clock signals CLK1 to CLKn. In an example embodiment, the number of inverters included in each of the inverter chains of the clock signal generator 20 is 2×(n+1), and is more than 2n that is the number of inverters included in each of the inverter chains of the data signal generator 10. Thus, the falling edges of the clock signals CLK1 to CLKn may be closer to the falling edge of the data signals DS1 to DSn, as approaching the nth D flip-flop 30_n from the first D flip-flop 30_1. Therefore, after sequentially measuring the respective output values of the first to nth D flip-flops 30_1 to 30_n, the primary D flip-flop 30_1 to 30_n whose output value is not '1' may be detected as the boundary point of the pass/fail (i.e., the critical point). Thereafter, the first hold time may be calculated using a difference in the number of inverters between the data path and the clock path from the first D flip-flop 30_1 to the critical point. For example, by multiplying the difference between the number of inverters included in the data path and the number of inverters included in the clock path from the first D flip-flop 30_1 to the critical point, by the real delay of each inverter described above with reference to FIG. 1, the first hold time may be calculated.

Referring again to the example of FIG. 3A, respective output values of the D flip-flops 30_1 to 30_n may be sequentially measured from the first D flip-flop 30_1. As the number of D flip-flops 30_1 to 30_n to be measured increases, the falling edge of the clock signal CLK# input to the D flip-flop becomes closer to the rising edge of the data signal DS# (①→②→③). As a result, the time period from the rising edge of the clock signal CLK# to the rising edge of the data signal DS# may be gradually reduced (t1>t2>t3>t4).

When the output values of the first to third D flip-flops 30_1-30_3 are '1' and the output value of the fourth D flip-flop 30_4 is '0,' the fourth D flip-flop 30_4 may be detected as a critical point. In this case, the first hold time may be calculated using the real delay of each inverter included in the timing data acquisition device 1 as described above.

Referring to FIGS. 3B and 1, when the value of the data signals DS1 to DSn changes from '0' to initial value '1,' in order for an output value of each of the first to nth D flip-flops 30_1 to 30_n to have a value of '0,' the second hold time may be a minimum length of a time period which the value of the data signal DS1 to DSn should maintain '0' in an interval after the falling edge of the clock signal CLK1 to CLKn.

In an example embodiment, the number of inverters included in each of the inverter chains of the clock signal generator 20 is greater than the number of inverters included in each of the inverter chains of the data signal generator 10. Thus, the falling edge of the clock signal CLK1 to CLKn may be closer to the rising edge of the data signals DS1 to DSn, as approaching the nth D flip-flop 30_n from the first D flip-flop 30_1. Therefore, after sequentially measuring the output values of the first D flip-flops 30_1 to nth D flip-flops 30_n, the primary D flip-flop 30_1 to 30_n whose measured output value is not '0' may be detected as the boundary point (i.e., a critical point) of the pass/fail. Thereafter, the second hold time may be calculated using the difference in the number of inverters between the data path and the clock path, from the first D flip-flop 30_1 to the critical point. For example, by multiplying the real delay of each of the inverters described above with reference to FIG. 1 by the difference between the number of inverters included in the data path and the number of inverters included in the clock path from the first D flip-flop 30_1 to the critical point, the second hold time may be calculated.

Referring again to the example of FIG. 3B, the output values of the respective D flip-flops 30_1 to 30_n may be sequentially measured from the first D flip-flop 30_1. As the length of the data path and the clock path increases, the falling edge of the clock signal CLK# input to the D flip-flop may become closer to the rising edge of the data signal DS# (①'→②'→③'). As a result, the time period from the falling edge of the clock signal CLK# to the rising edge of the data signal DS# may be gradually reduced (t1'>t2'>t3'>t4').

When the output values of the first to third D flip-flops 30_1 to 30_3 are '0' and the output value of the fourth D flip-flop 30_4 is '1,' the fourth D flip-flop 30_4 may be detected as a critical point. In this case, the second hold time may be calculated using the real delay of each inverter included in the timing data acquisition device 1 as described above.

The first hold time and the second hold time, calculated using the method described above with reference to FIGS. 3A and 3B, are actual values, and may have a relatively high accuracy as compared with that of first and second hold times collected by using various tools based on predefined on-chip variation (OCV) factor values.

Figure 4:
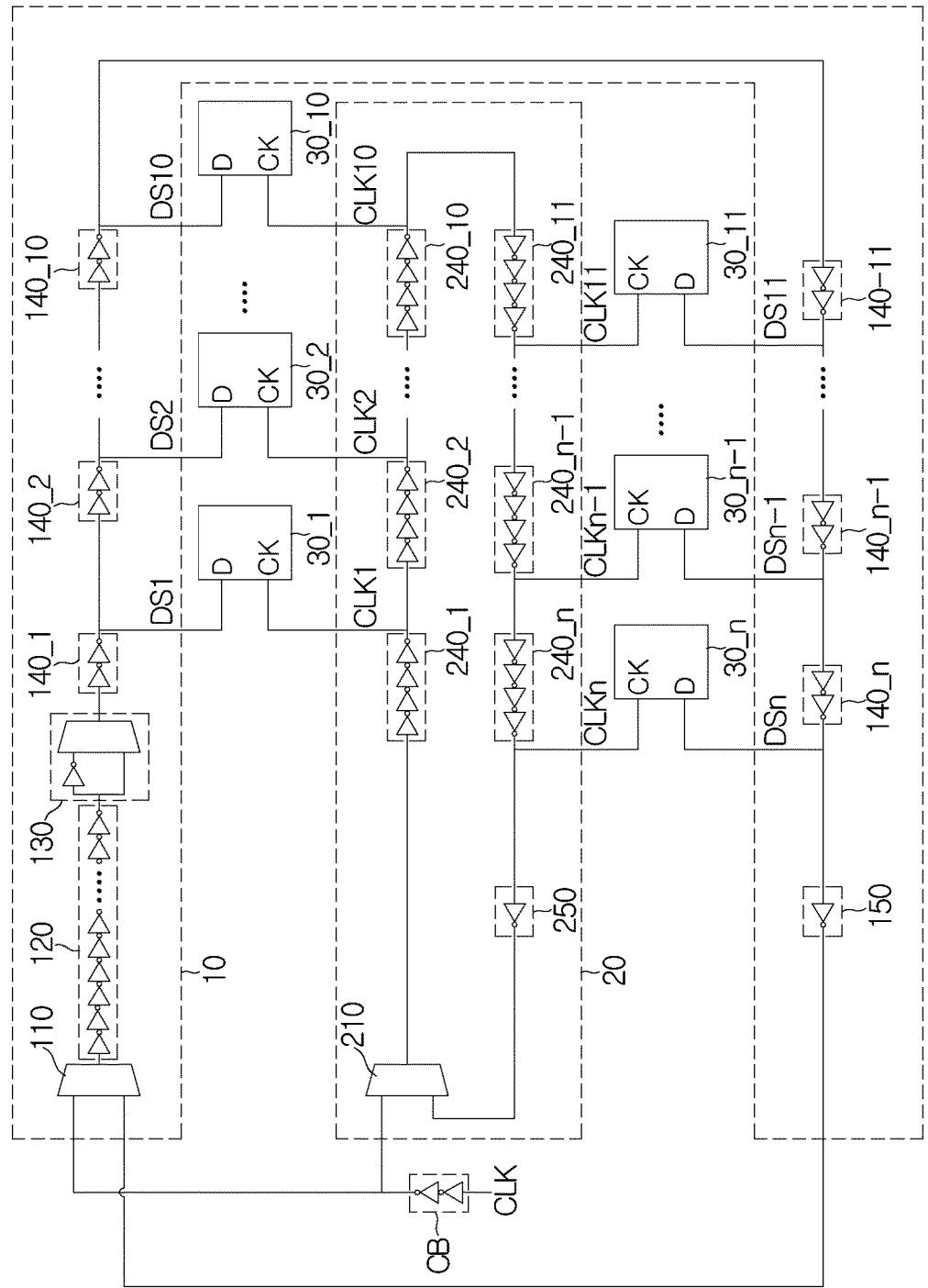
FIG. 4 is a circuit diagram illustrating an example of the timing data acquisition device of FIG. 1 in consideration of the arrangement of a plurality of D flip-flops.

FIG. 4 is a circuit diagram illustrating an example of the timing data acquisition device of FIG. 1 in consideration of the arrangement of a plurality of D flip-flops. Referring to FIG. 4, a timing data acquisition device 1_1 may include a data signal generator 10, a clock signal generator 20, and a plurality of D flip-flops 30_1 to 30_n.

The data signal generator 10 may receive the external clock signal CLK through the clock buffer CB, may generate first to nth data signals DS1 to DSn as an oscillation signal, and may provide the generated first to nth flip-flop signals to the D flip-flops 30_1 to 30_n, respectively. In an example embodiment, the first through nth data signals DS1 to DSn may be sequentially delayed signals.

The clock signal generator 20 may receive the external clock signal CLK through the clock buffer CB and may generate first to nth clock signals CLK1 to CLKn as an oscillation signal, and may provide the generated first to nth clock signals CLK1 to CLKn to the first to nth D flip-flops 30_1 to 30_n, respectively. In an example embodiment, the first to nth clock signals CLK1 to CLKn may be sequentially delayed signals.

The plurality of D flip-flops 30_1 to 30_n may be disposed on two or more parallel lines. For example, first to tenth D flip-flops 30_1 to 30_10 may be sequentially disposed on the first line, and the eleventh to nth D flip-flops 30_11 to 30_n may be sequentially disposed on one second line parallel to the first line. As such, in the timing data acquisition device 1_1 according to an example embodiment, the plurality of D flip-flops 30_1 to 30_n are not arranged on one line, but are disposed to be distributed on two or more parallel lines, thereby significantly reducing a metal line length of the feedback loop for generating the oscillation signal. In addition, by significantly reducing a real delay of each inverter included in the data signal generator 10 and the clock signal generator 20, the timing data acquisition device 1_1 may collect more accurate timing data in picoseconds (ps). On the other hand, although FIG. 4 illustrates that the plurality of D flip-flops 30_1 to 30_*n* are sequentially disposed on two parallel lines, as merely being illustrative, embodiments thereof are not limited thereto. For example, the plurality of D flip-flops 30_1 to 30_*n* may be distributed on three parallel lines.

Figure 5:
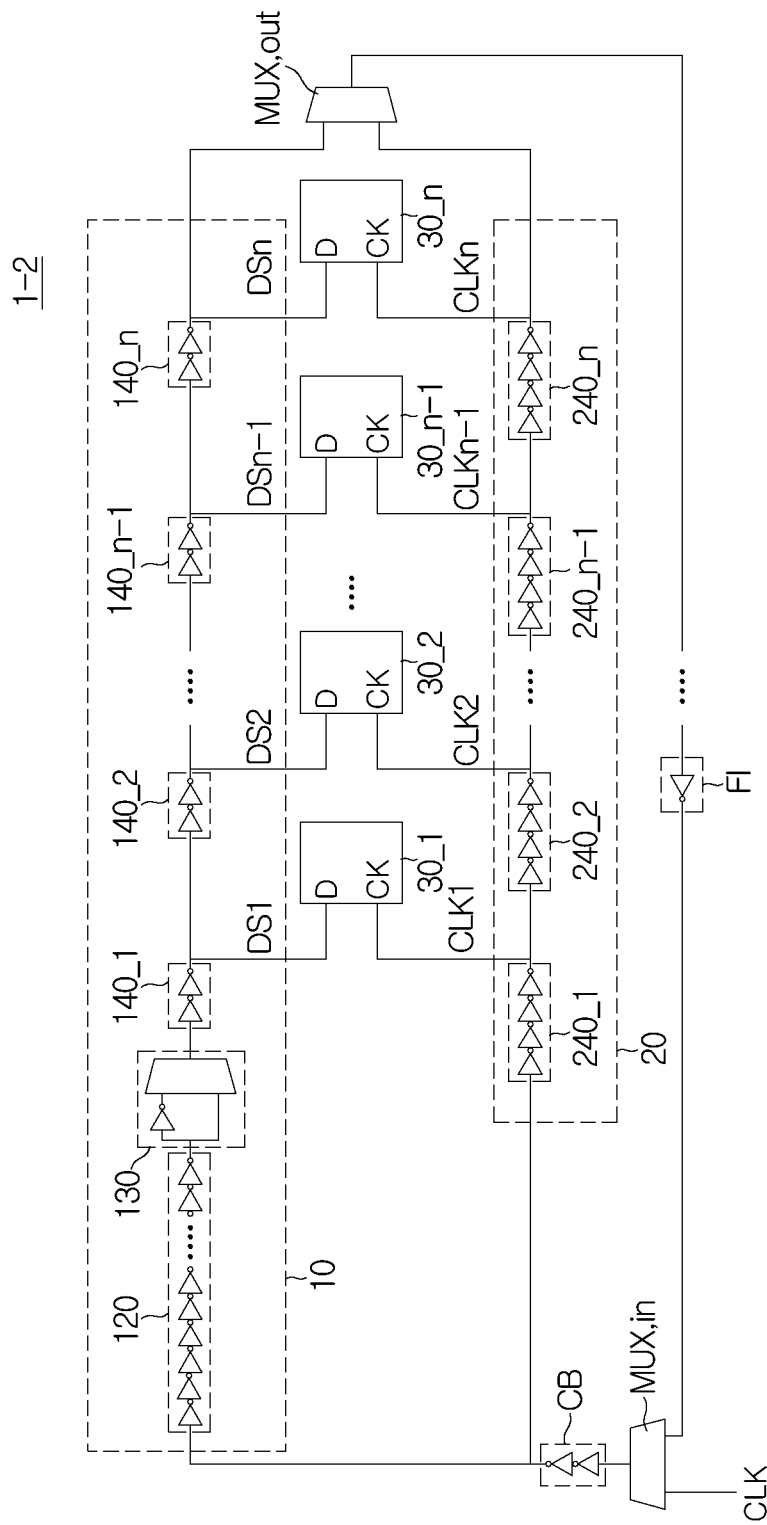
FIG. 5 is a circuit diagram illustrating a modified example of the timing data acquisition device of FIG. 1.

FIG. 5 is a circuit diagram illustrating a modified example of the timing data acquisition device of FIG. 1. Referring to FIG. 5, a timing data acquisition device 1_2 may include an input multiplexer MUX,in, a data signal generator 10, a clock signal generator 20, a plurality of D flip-flops 30_1 to 30_*n*, an output multiplexer MUX,out, and an oscillating inverting unit FI.

The data signal generator 10 and the clock signal generator 20 may receive an external clock signal CLK through the input multiplexer MUX,in and a clock buffer CKB connected to an output terminal of the input multiplexer MUX, in.

The nth data signal DSn generated by the data signal generator 10 may be fed back to the input terminal of the input multiplexer MUX,in through the output multiplexer MUX,out and the oscillating inverting unit FI connected to an output terminal of the output multiplexer MUX,out. In an example embodiment, the oscillating inverting portion FI may include an odd number of inverters. The output multiplexer MUX,out selectively may output an inverted signal of the nth data signal DSn fed back through the oscillating inverting unit FI, thereby enabling a ring oscillator function based on a real path.

In addition, the nth clock signal CLKn generated by the clock signal generator 20 may be fed back to an input terminal of the input multiplexer MUX,in through the output multiplexer MUX,out and the oscillating inverting unit FI. The output multiplexer MUX,out may enable a real path-based ring oscillator function by selectively outputting an inverted signal of the nth clock signal CLKn fed back through the oscillating inverting unit FI.

Unlike the timing data acquisition device 1 of FIG. 1, the timing data acquisition device 1_2 may generate a first oscillation signal to calculate a real delay of respective inverters 140_1 to 140_*n* on a data path and a second oscillation signal to calculate a real delay of respective inverters 240_1 to 240_*n* on a clock path, from one feedback loop using the output multiplexer MUX,out.

Figure 6:
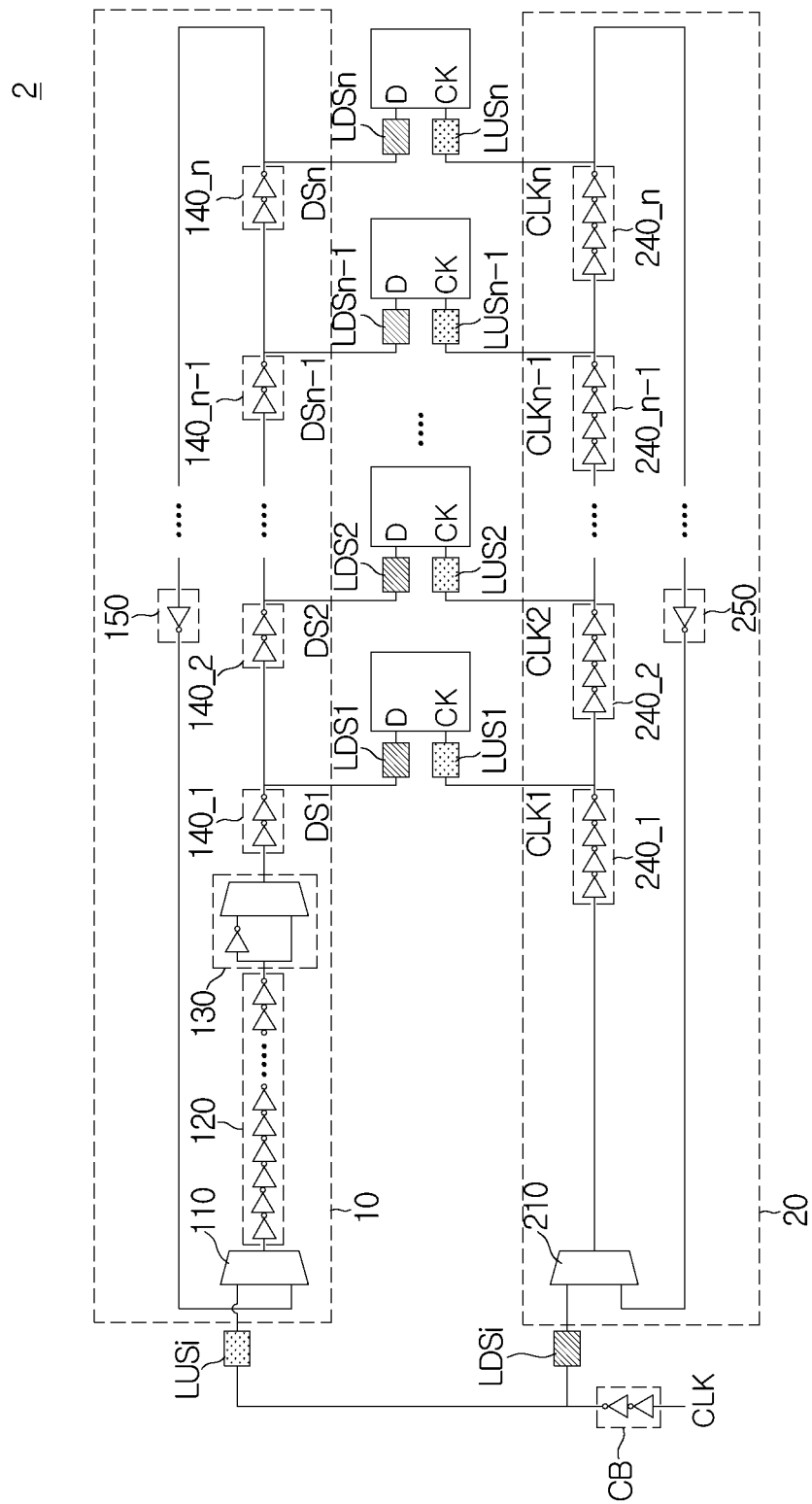
FIG. 6 is a circuit diagram illustrating a timing data acquisition device according to an example embodiment.

FIG. 6 is a circuit diagram illustrating a timing data acquisition device according to an example embodiment. Referring to FIG. 6, a timing data acquisition device 2 may include a data signal generator 10, a clock signal generator 20, and a plurality of D flip-flops 30_1 to 30_*n*. The data signal generator 10 may include a multiplexer 110, an offset generator 120, a mode selector 130, first to nth data signal delay units 140_1 to 140_*n*, and a first oscillating inverting unit 150.

The multiplexer 110 may receive an external clock signal CLK and a data signal, and may selectively output one of the received signals. In an example embodiment, the data signal may be an inverted signal of the nth data signal DSn fed back through the first oscillating inverting unit 150. This first oscillating inverting unit 150 may include 2n−1 inverters (where n is a natural number), and may be disposed in a feedback loop of the data signal generator 10 to be used for generating an oscillation signal.

The first to nth data signal delay units 140_1 to 140_*n* may configure a data path. In particular, the first to nth data signal delay units 140_1 to 140_*n* continuously add a predetermined delay to the output signal of the mode selector 130 to generate the first to nth data signals DS1 to DSn, and may transfer the generated first to nth data signals DS1 to DSn to data input terminals D of the first to nth D flip-flops 30_1 to 30_*n*, respectively.

Each of the first to nth data signal delay units 140_1 to 140_*n* may include an inverter chain to add a predetermined delay to the output signal of the mode selector 130. In an example embodiment, each of the first to nth data signal delay units 140_1 to 140_*n* may include 2n inverters (where n is a natural number). For example, each of the first to nth data signal delay units 140_1 to 140_*n* may include two inverters.

The nth data signal DSn output from the nth data signal delay unit 140_*n* may be fed back to the input terminal of the multiplexer 110 through the first oscillating inverting unit 150 to generate an oscillation signal. In addition, the multiplexer 110 selectively may output an inverted signal of the nth data signal DSn fed back through the first oscillating inverting unit 150, thereby enabling a ring oscillator function based on a real path. In this case, by measuring the frequency of the oscillation signal generated by the data signal generator 10 at the output terminal of the multiplexer 110, the real delay of each inverter included in the first to nth data signal delay unit 140_1 to 140_*n* may be calculated.

The clock signal generator 20 may include a multiplexer 210, first to nth clock signal delay units 240_1 to 240_*n*, and a second oscillating inverting unit 250. The first to nth clock signal delay units 240_1 to 240_*n* may configure a clock path. The first to nth clock signal delay units 240_1 to 240_*n* continuously add a predetermined delay to the output signal of the multiplexer 210 to generate the first to nth clock signals CLK1 to CLKn, and may provide the generated first to nth clock signals CLK1 to CLKn to the clock input terminals CK of the first to nth D flip-flops 30_1 to 30_*n*, respectively.

Each of the first to nth clock signal delay units 240_1 to 240_*n* may include an inverter chain to add a predetermined delay to the output signal of the multiplexer 210. In an example embodiment, each of the first to nth clock signal delay units 240_1 to 240_*n* may include 2×(n+1) inverters (where n is a natural number). For example, each of the first to nth clock signal delay units 240_1 to 240_*n* may include four inverters.

The nth clock signal CLKn output from the nth clock signal delay unit 240_*n* may be fed back to the input terminal of the multiplexer 210 through the second oscillating inverting unit 250 to generate an oscillation signal. In addition, the multiplexer 210 may output an inverted signal of the nth clock signal CLKn fed back through the second oscillating inverting unit 250 to thereby enable a ring oscillator function based on a real path. In this case, by measuring the frequency of the oscillation signal generated by the clock signal generator 20 at the output terminal of the multiplexer 210, the real delay of each inverter included in the first to nth clock signal delay units 240_1 to 240_*n* may be calculated. Timing skew is calculated by subtracting a real delay of each of the first to nth data signal delay units 140_1 to 140_*n* from the real delay of each of the first to nth clock signal delay units 240_1 to 240_*n*.

For example, when each of the first to nth data signal delay units 140_1 to 140_*n* includes two inverters having a first delay, and each of the first to nth clock signal delay units 240_1 to 240_*n* includes four inverters having a second delay, the timing skew may be calculated by multiplying a value obtained by subtracting the first delay value from the second delay value by two (2), which is the difference of the number of inverters included in each of the first to nth data signal delay units 140_1 to 140_n and the number of inverters included in each of the first to nth clock signal delay units 240_1 to 240_n. As a result, the timing skew calculated at the predetermined critical point may be two or more times the real delay of each inverter.

In an example embodiment, to significantly reduce timing skew to collect more accurate timing data, the timing data acquisition device 2 may control operating power of the data signal generator 10 including the data path, the clock signal generator 20 including the clock path, and the plurality of D flip-flops 30_1 to 30_n, to have different levels. For example, when the level of the operating power of the plurality of D flip-flops 30_1 to 30_n is a first level, the timing data acquisition device 2 controls the level of the operating power of the data signal generator 10 to have a second level, lower than the first level, and controls the level of the operating power of the clock signal generator 20 to have a third level, higher than the first level. As the data signal generator 10 operates at a second level, lower than the first level, the timing of each of the first through nth data signals DS1 to DSn output from the data signal generator 10 may be slowed down. In addition, as the clock signal generator 20 operates at the third level higher than the first level, timing of each of the first to nth clock signals CLK1 to CLKn output from the clock signal generator 20 may be relatively fast. As a result, the interval between adjacent edges of respective data signals DS1 to DSn and corresponding clock signals CLK1 to CLKn is narrowed, and thus, the magnitude of the timing skew may be reduced to twice the real delay of each inverter, or lower. Thus, the timing data acquisition device 2 may measure set-up time and hold time relatively more accurately.

To control the operating power of the data signal generator 10, the clock signal generator 20, and the plurality of D flip-flops 30_1 to 30_n, for example, the levels of the output voltages differently, the timing data acquisition device 2 may include first to nth level-down shifters LDS1 to LDSn connected to output terminals for the first to nth data signals DS1 to DSn, respectively, and first to nth level-up shifters LUS1 to LUSn to output terminals for the first to nth clock signals CK1 to CKn, respectively.

In addition, to eliminate the delay caused by the first to nth level-up shifters LUS1 to LUSn and the first to nth level-down shifters LDS1 to LDSn themselves, the timing data acquisition device 2 may include an input level-up shifter LUSi and an input level-down shifter LDSi. Since the delays due to the input level-up shifter LUSi and the first to nth level-down shifters LDS1 to LDSn respectively are the same as the delays generated by the input level-down shifter LDSi and the first to nth level-up shifters LUS1 to LUSn respectively, the delays generated by the first to nth level-up shifters LUS1 to LUSn and the first to nth level-down shifters LDS1 to LDSn may be offset from each other in a timing data collection process.

The input level-up shifter LUSi is connected to an external clock signal CLK input terminal of the multiplexer 110 of the data signal generator 10 to increase the level of the input signal at the same scale as the first to nth level-up shifters LUS1 to LUSn. The input level-down shifter LDSi is connected to an external clock signal CLK input terminal of the multiplexer 210 of the clock signal generator 20 to lower the level of the input signal at the same scale as the first to nth level-down shifters LDS1 to LDSn.

Figure 7:
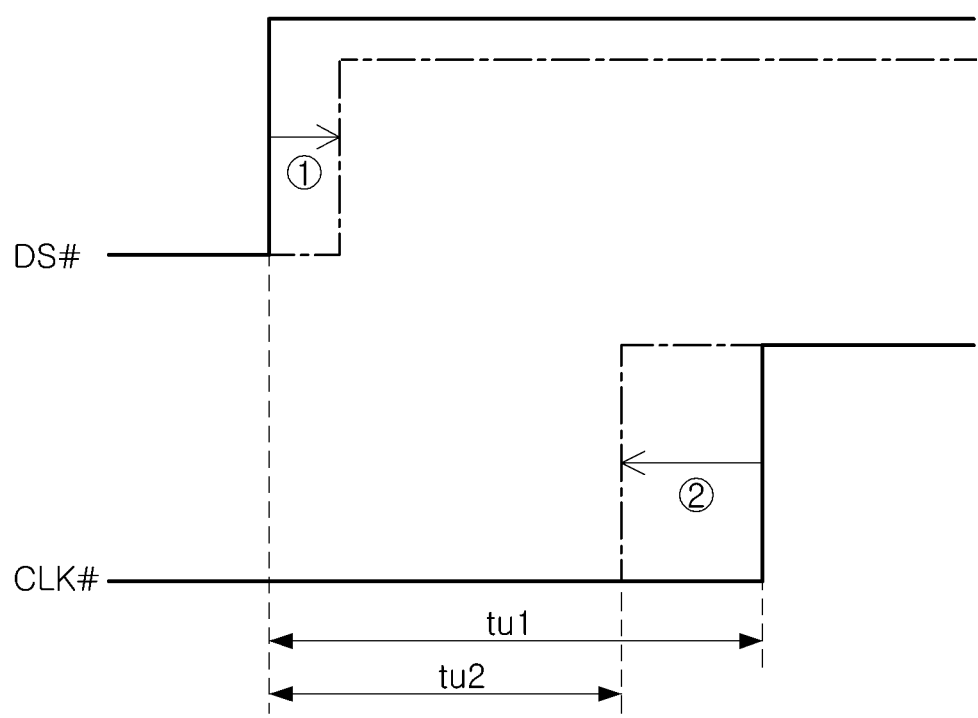
FIG. 7 is a timing diagram illustrating a method of lowering timing skew using the timing data acquisition device of FIG. 6.

Hereinafter, a method of lowering timing skew using the first to nth level-up shifters LUS1 to LUSn and the first to nth level-down shifters LDS1 to LDSn will be described in detail with reference to FIG. 7, which is a timing diagram illustrating a method of lowering timing skew using the timing data acquisition device of FIG. 6. Referring to FIGS. 7 and 6, the timing skew may be a length of a time period (time unit tu) between the rising edge of the data signal DS# and the rising edge of the clock signal CLK#.

On the other hand, the first to nth level-down shifters LDS1 to LDSn may lower the levels of the data signals DS# input to the data input terminals D of the first to nth D flip-flops 30_1 to 30_n, to a predetermined scale, respectively. In this case, the data signals DS# may be slowed by a predetermined first time (①).

In addition, the first to nth level-up shifters LUS1 to LUSn may increase the levels of the clock signals CLK# input to the clock input terminals CK of the first to nth D flip-flops 30_1 to 30_n, to a predetermined scale, respectively. In this case, the clock signals CLK# may be accelerated by a predetermined second time (②).

The data signal DS# is slowed down by the first to nth level-down shifters LDS1 to LDSn, and the clock signal CLK# is accelerated by the first to nth level-up shifters LUS1 to LUSn. As a result, the magnitude of the timing skew may be reduced (tu1→tu2).

In an example embodiment, the magnitude of the timing skew may be changed by adjusting the scale values of the first to nth level-down shifters LDS1 to LDSn and the scale values of the first to nth level-up shifters LUS1 to LUSn. For example, according to the simulation result, when the level of the data signal DS# is adjusted to 0.675 V using the first to nth level-down shifters LDS1 to LDSn, and the level of the clock signal CLK# is adjusted to 0.825 V using the first to nth level-up shifters LUS1 to LUSn, the timing skew may be measured as 0.013625 ns. For example, the time skew is reduced about 61% as compared with the case of the timing skew of 0.022264 ns, in which the levels of the data signal DS# and the clock signal CLK# are both 0.675 V, and the timing skew is reduced about 75% as compared with the case of the timing skew of 0.0179446 ns, in which the levels of the data signal DS# and the clock signal CLK# are both 0.825V.

Figure 8:
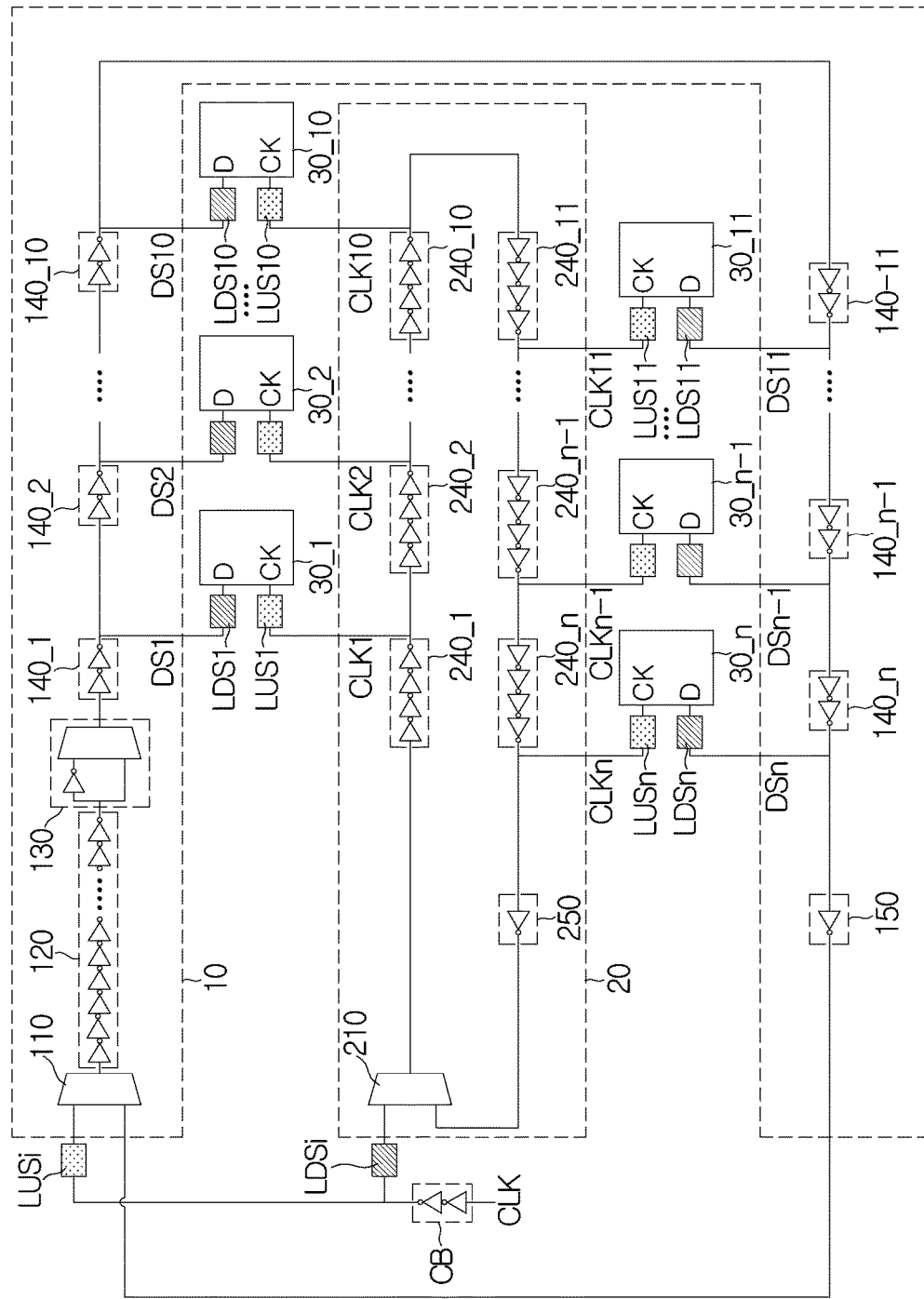
FIG. 8 is a circuit diagram illustrating an example of the timing data acquisition device of FIG. 6 in consideration of arrangement of a plurality of D flip-flops.

FIG. 8 is a circuit diagram illustrating an example of the timing data acquisition device of FIG. 6 in consideration of the arrangement of a plurality of D flip-flops. Referring to FIG. 8, a timing data acquisition device 2_1 may include a data signal generator 10, a clock signal generator 20, and a plurality of D flip-flops 30_1 to 30_n. The plurality of D flip-flops 30_1 to 30_n may be disposed on two or more parallel lines as described above with reference to FIG. 4. For example, first to tenth D flip-flops 30_1 to 30_10 may be sequentially disposed on the first line, and the eleventh to nth D flip-flops 30_11 to 30_n may be sequentially disposed on the second line parallel to the first line. As such, the plurality of D flip-flops 30_1 to 30_n are disposed on two or more parallel lines to be distributed, rather than being disposed in line on one line, thereby significantly reducing the metal line length of the feedback loop. As a result, by significantly reducing a real delay of each inverter included in the data signal generator 10 and the clock signal generator 20, the timing data acquisition device 1_2 may collect more accurate timing data in picosecond (ps) units. On the other hand, although FIG. 8 illustrates that the plurality of D flip-flops 30_1 to 30_n are sequentially disposed on two parallel lines, which is merely illustrative, embodiments are not limited thereto. For example, the plurality of D flip-flops 30_1 to 30_n may also be sequentially arranged on three parallel lines.

Figure 9:
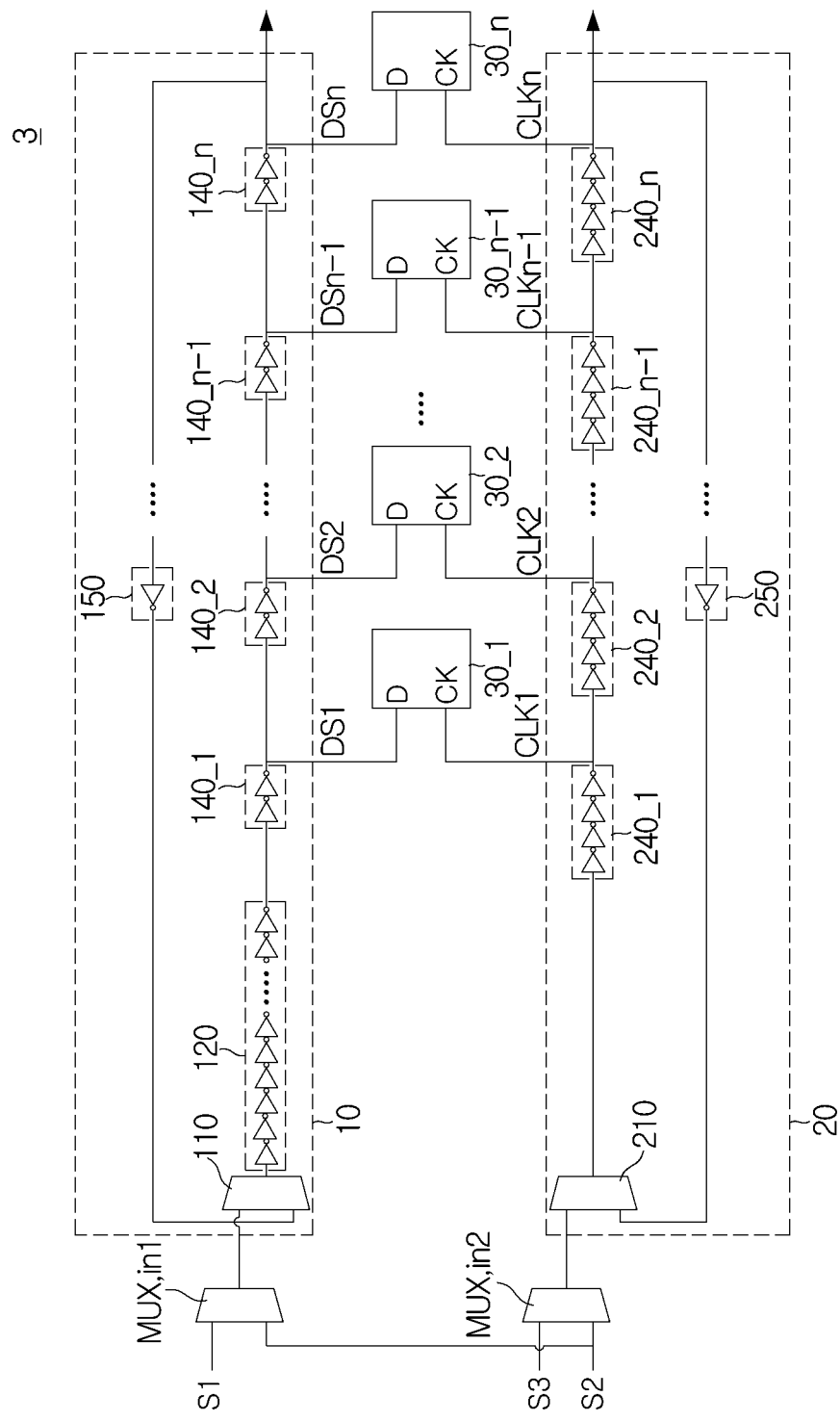
FIG. 9 is a circuit diagram illustrating a timing data acquisition device according to an example embodiment.

FIG. 9 is a circuit diagram illustrating a timing data acquisition device according to an example embodiment. Referring to FIG. 9, a timing data acquisition device 3 may include a data signal generator 10, a clock signal generator 20, a plurality of D flip-flops 30_1 to 30_n, a first input multiplexer MUX,in1, and a second input multiplexer MUX, in2. Unlike the timing data acquisition device of FIGS. 1 to 8 in which the input of the data path and the clock path are unified, the timing data acquisition device 3 is configured in such a manner that the input of the data path and the clock path is dualized and, therefore, may be used to measure the clock-to-delay of various semiconductor devices included in the semiconductor circuit under test.

The first input multiplexer MUX,in1 may receive a first signal S1 and a second signal S2, and selectively output one of the received signals. In an example embodiment, the first signal S1 may be a predetermined data signal DS, and the second signal S2 may be a first external clock signal CLK1. The second input multiplexer MUX,in2 may receive the second signal S2 and a third signal S3, and may selectively output one of the received signals. In an example embodiment, the second signal S2 may be the first external clock signal CLK1, and the third signal S3 may be a second external clock signal CLK2.

The timing data acquisition device 3 may use a first clock-to-delay measured using the first signal S1 and the third signal S3, and a second clock-to-delay measured using the second signal S2, to eliminate set-up time noise of the plurality of respective D flip-flops 30_1 to 30_n. For example, the timing data acquisition device 3 may remove the set-up time noise of the plurality of respective D flip-flops 30_1 to 30_n by subtracting the second clock-to-delay from the first clock-to-delay.

The data signal generator 10 selectively may receive the first signal S1 and the second signal S2 from the first input multiplexer MUX,in1, may generate the first to nth data signals DS1 to DSn as oscillation signals, and may provide the generated signals to the first to nth D flip-flops 30_1 to 30_n, respectively. In an example embodiment, the first through nth data signals DS1 to DSn may be sequentially delayed signals.

The data signal generator 10 may include a multiplexer 110, an offset generator 120, first to nth data signal delay units 140_1 to 140_n, and a first oscillating inverting unit 150. The details of the configurations are as described above with reference to FIG.

The multiplexer 110 may receive an output signal of the first input multiplexer MUX,in1 and an inverted signal of the nth data signal DSn fed back through the first oscillating inverting unit 150, and may selectively output one of the received signals. The first oscillating inverting unit 150 may include 2n−1 inverters (where n is a natural number) and may be disposed in a feedback loop of the data signal generator 10, which is a data path to generate an oscillation signal.

The offset generator 120 may include a plurality of inverters connected between an output terminal of the multiplexer 110 and an input terminal of the mode selector 130, and may add an offset delay for distinguishing signals from each other, to the output signal of the multiplexer 110.

The first to nth data signal delay units 140_1 to 140_n repeatedly add a predetermined delay to the output signal of the multiplexer 110 to generate the first to nth data signals DS1 to DSn, and may transfer the generated signals to data input terminals D the first to nth D flip-flops 30_1 to 30_n, respectively. For example, the first data signal delay unit 140_1 may generate a first data signal DS1 by adding a delay of a first time to the output signal of the mode selector 130, and may transfer the generated signal to the data input terminal D of the first D flip-flop 30_1. In addition, the second data signal delay unit 140_2 may add a delay of a first time to the first data signal DS1 to generate the second data signal DS2, and may transfer the generated signal to the data input terminal D of the second data flip-flop 30_2. In this case, the second data signal DS2 may be a signal in which a delay of the first time multiplied by two (2) is added to the output signal of the mode selector 130. Similarly, the nth data signal delay unit 140_n may generate the nth data signal DSn by adding a delay of the first time to the n−1th data signal DSn−1 and may transfer the generated signal to the data input terminal D of the nth D flip-flop 30_n. In this case, the nth data signal DSn may be a signal in which a delay of the first time multiplied by n is added to the output signal of the mode selector 130.

Each of the first to nth data signal delay units 140_1 to 140_n may include an inverter chain to add a predetermined delay to the output signal of the mode selector 130. In an example embodiment, each of the first to nth data signal delay units 140_1 to 140_n may include 2n inverters (where n is a natural number). For example, each of the first to nth data signal delay units 140_1 to 140_n may include two inverters.

The nth data signal DSn output from the nth data signal delay unit 140_n may be fed back to the input terminal of the multiplexer 110 through the first oscillating inverting unit 150 to generate an oscillation signal. In addition, the multiplexer 110 may output an inverted signal of the nth data signal DSn fed back through the first oscillating inverting unit 150 to thereby enable a ring oscillator function based on a real path. In this case, by measuring the frequency of the oscillation signal generated by the data signal generator 10 at the output terminal of the multiplexer 110, the real delay of each inverter included in the first to nth data signal delay units 140_1 to 140_n may be calculated.

The clock signal generator 20 selectively may receive the second signal S2 and the third signal S3 from the second input multiplexer MUX,in2, and may output the first to nth clock signals CLK1-CLKn as oscillation signals, and may provide the first to nth clock signals CLK1 to CLKn to the first to nth D flip-flops 30_1 to 30_n, respectively. In an example embodiment, the first to nth clock signals CLK1 to CLKn may be sequentially delayed signals. For example, the second clock signal CLK2 may be a signal obtained by delaying the first clock signal CLK1 by a first time, and the nth clock signal CLKn may be a signal obtained by delaying the n−1th clock signal CLKn−1 by the first time. As a result, the nth clock signal CLKn may be a signal obtained by delaying the first clock signal CLK1 by the first time multiplied by n.

The clock signal generator 20 may include a multiplexer 210, first to nth clock signal delay units 240_1 to 240_n, and a second oscillating inverting unit 250. The multiplexer 210 may receive an output signal of the second input multiplexer MUX,in2 and an inverted signal of the nth clock signal CLKn fed back through the second oscillating inverting unit 250, and may selectively output one of the received signals. The second oscillating inverting unit 250 may include 2n−1 inverters (where n is a natural number), and may be disposed in a feedback loop of the clock signal generator 20 which is a clock path, to generate the oscillation signal.

The first to nth clock signal delay units 240_1 to 240_n continuously add a predetermined delay to the output signal of the multiplexer 210 to generate the first to nth clock signals CLK1 to CLKn, and may transfer the generated signals to the clock input terminals CK of the first to nth D flip-flops 30_1 to 30_n, respectively. For example, the first clock signal delay unit 240_1 may generate a first clock signal CLK1 by adding a delay of a second time to the output signal of the multiplexer 210, and may transfer the generated signal to the clock input terminal CK of the first D flip-flop 30_1. In addition, the second clock signal delay unit 240_2 may generate a second clock signal CLK2 by adding a delay of a second time to the first clock signal CLK1 and may transfer the generated signal to the clock input terminal CK of the second D flip flop 30_2. In this case, the second clock signal DS2 may be a signal in which a delay of a second time multiplied by two (2) is added to the output signal of the multiplexer 210. Similarly, the nth clock signal delay unit 240_n may generate an nth clock signal CLKn by adding a delay of a second time to the n−1th clock signal CLKn−1, and may transfer the generated signal to the clock input terminal CK of the nth D flip-flop 30_n. In this case, the nth clock signal CLKn may be a signal in which a delay of a second time multiplied by n is added to the output signal of the multiplexer 210. On the other hand, the second time that is the magnitude of the delay of each of the first to nth clock signal delay units 240_1 to 240_n may be greater than the first time that is the magnitude of the delay of each of the first to nth data signal delay units 140_1 to 140_n.

Each of the first to nth clock signal delay units 240_1 to 240_n may be implemented as an inverter chain to add a predetermined delay to the output signal of the multiplexer 210. In an example embodiment, each of the first to nth clock signal delay units 240_1 to 240_n may include 2×(n+1) inverters (where n is a natural number). For example, each of the first to nth clock signal delay units 240_1 to 240_n may include four inverters.

The nth clock signal CLKn output from the nth clock signal delay unit 240_n may be fed back to the input terminal of the multiplexer 210 through the second oscillating inverting unit 250 to generate an oscillation signal. In addition, the multiplexer 210 may output an inverted signal of the nth clock signal CLKn fed back through the second oscillating inverting unit 250 to thereby enable a ring oscillator function based on a real path. In this case, by measuring the frequency of the oscillation signal generated by the clock signal generator 20 at the output terminal of the multiplexer 210, the real delay of each inverter included in the first to nth clock signal delay units 240_1 to 240_n may be calculated. The timing skew may be calculated by subtracting a real delay value of each of the first to nth data signal delay units 140_1 to 140_n from a real delay value of each of the first to nth clock signal delay units 240_1 to 240_n. For example, when each of the first to nth data signal delay units 140_1 to 140_n includes two inverters having a first delay value, and each of the first to nth clock signal delay units 240_1 to 240_n includes four inverters having a second delay value, the timing skew may be calculated by multiplying 2, which is a difference of the number of inverters, by a value obtained by subtracting the first delay value from the second delay value. Hereinafter, a method of measuring the clock-to-delay by the timing data acquisition device 3 of FIG. 9 will be described in detail with reference to FIG. 10.

Figure 10:
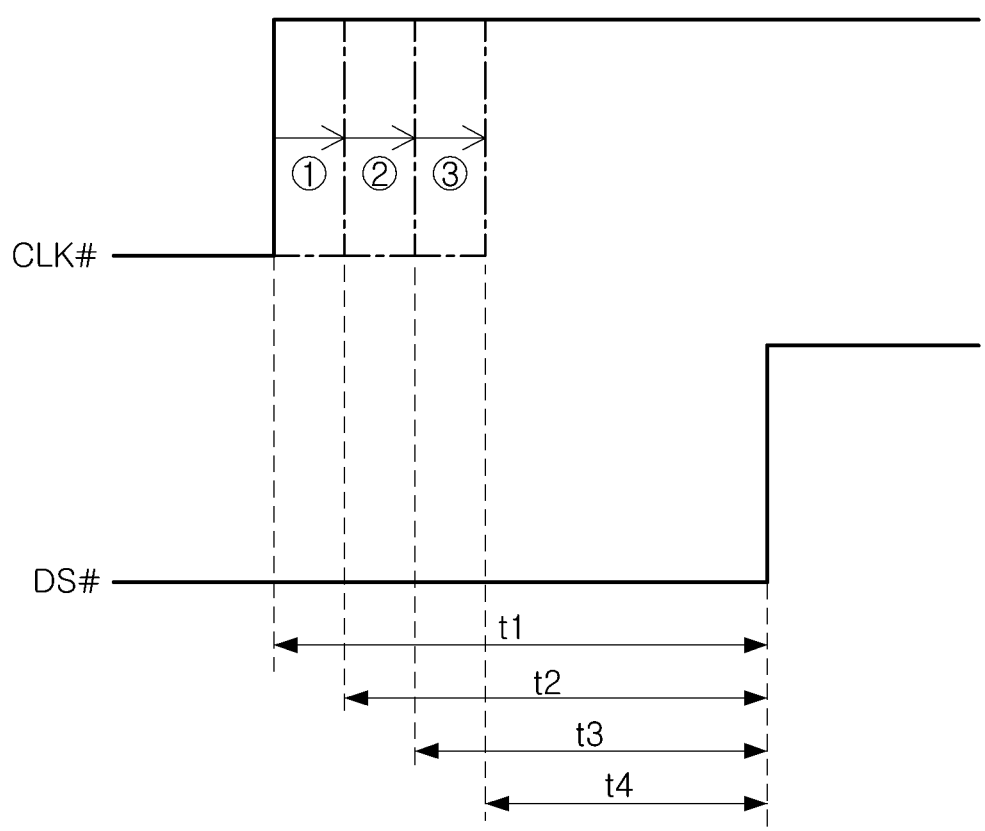
FIG. 10 is a timing diagram illustrating a method of measuring delay/access time using the timing data acquisition device of FIG. 9.

FIG. 10 is a timing diagram illustrating a method of measuring a clock-to-delay by the timing data acquisition device of FIG. 9. Referring to FIGS. 10 and 9, a clock-to-delay tcd may indicate a minimum time required to obtain a valid output value Q at the output terminals of the first to n-th D flip-flops 30_1 to 30_n, after a state change occurs in the clock signal input to each of the first to n-th D flip-flops 30_1 to 30_n.

In an example embodiment, the number of inverters included in each of the inverter chains of the clock signal generator 20 is 2×(n+1), and is greater than 2n that is the number of inverters included in each of the inverter chains of the data signal generator 10. Therefore, the rising edges of the clock signals CLK1 to CLKn may be closer to the rising edges of the data signals DS1 to DSn, as approaching the n-th D flip-flop 30_n from the first D flip-flop 30_1. Accordingly, by sequentially measuring the output values Q of the respective first D flip-flops 30_1 to nth D flip-flops 30_n, the D-Flip-flop 30_1 to 30_n of which the output value Q changes from '0' to '1' may be detected as a critical point. Thereafter, the clock-to-delay tcd may be calculated using the difference in the number of inverters from the first D flip-flop 30_1 to the critical point. For example, the clock-to-delay tcd may be calculated by multiplying the difference in the number of inverters from the first D flip-flop 30_1 to the critical point by the real delay value of each inverter described above with reference to FIG. 9.

Referring again to the example of FIG. 10, output values of the respective D flip-flops 30_1 to 30_n may be sequentially measured from the first D flip-flop 30_1. The longer the data path and the clock path (for example, the higher the order of the D flip-flops 30_1 to 30_n to be measured), the rising edge of the clock signal CLK# input to the D flip-flop may be close to the rising edge of the data signal DS# (①→②→③). As a result, the time period from the rising edge of the clock signal CLK# to the rising edge of the data signal DS# may be gradually reduced (t4<t3<t2<t1).

For example, when the output values of the first to third D flip-flops 30_1 to 30_3 are '0' and the output value of the fourth D flip-flop 30_4 is '1,' the fourth D flip-flop 30_4 may be detected as a critical point. In this case, the clock-to-delay tcd may be calculated using the real delay value of the inverter included in the timing data acquisition device 3 as described above.

Figure 11:
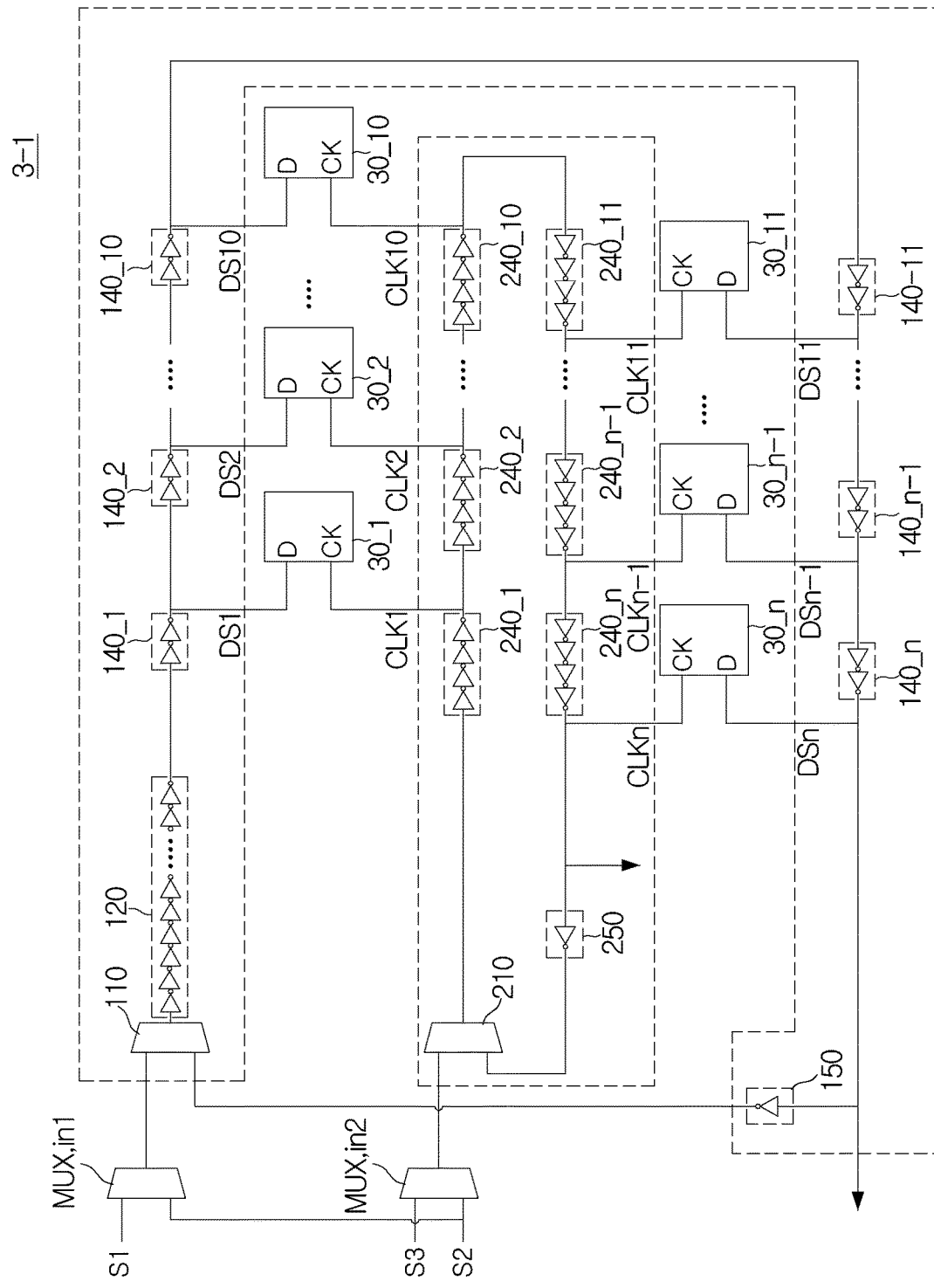
FIG. 11 is a circuit diagram illustrating an example of the timing data acquisition device of FIG. 9 in consideration of arrangement of a plurality of D flip-flops.

FIG. 11 is a circuit diagram illustrating an example of the timing data acquisition device of FIG. 9 in consideration of arrangement of a plurality of D flip-flops. Referring to FIG. 11, a timing data acquisition device 3_1 may include a data signal generator 10, a clock signal generator 20, a plurality of D flip-flops 30_1 to 30_n, a first input multiplexer MUX, in1, and a second input multiplexer MUX,in2.

The plurality of D flip-flops 30_1 to 30_n may be disposed on two or more parallel lines as described above with reference to FIG. 4. For example, first to tenth D flip-flops 30_1 to 30_10 may be sequentially disposed on the first line, and eleventh to nth D flip-flops 30_11 to 30_n may be sequentially arranged on one second line parallel to the first line. As such, by distributing the plurality of D flip-flops 30_1 to 30_n on two or more parallel lines rather than in line on one line, the metal line length of the feedback loop may be significantly reduced. In addition, in this case, by significantly reducing a real delay of each inverter included in the data signal generator 10 and the clock signal generator 20, the timing data acquisition device 3_1 may collect more accurate timing data in the unit of picoseconds (ps). On the other hand, although FIG. 11 illustrates that the plurality of D flip-flops 30_1 to 30_n are sequentially disposed on two parallel lines by being merely illustrative, embodiments thereof are not limited thereto. For example, the plurality of D flip-flops 30_1 to 30_n may be sequentially arranged on three parallel lines.

Figure 12:
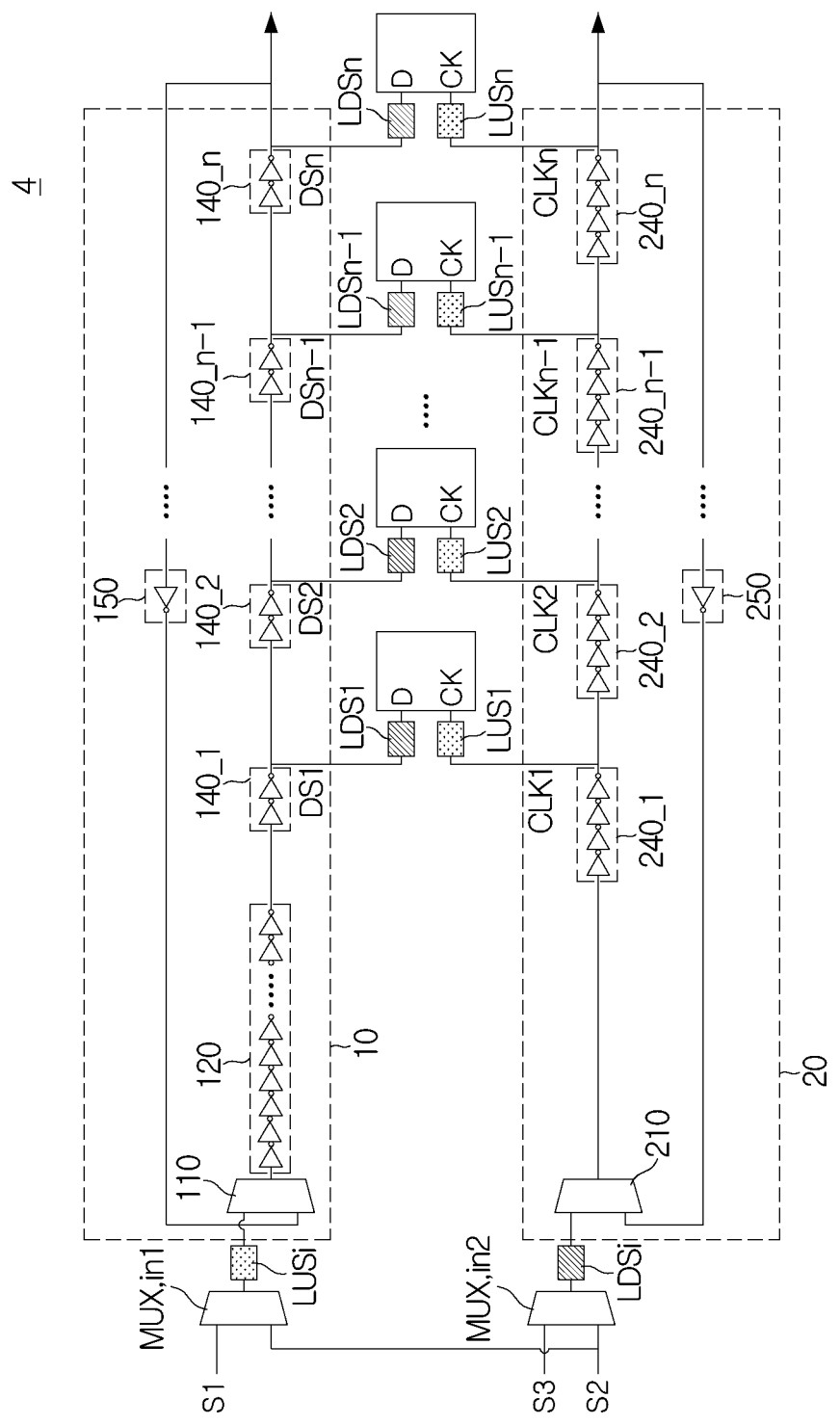
FIG. 12 is a circuit diagram illustrating a timing data acquisition device according to an example embodiment.

FIG. 12 is a circuit diagram illustrating a timing data acquisition device according to an example embodiment. Referring to FIG. 12, a timing data acquisition device 4 may include a data signal generator 10, a clock signal generator 20, a plurality of D flip-flops 30_1 to 30_n, a first input multiplexer MUX,in1, and a second input multiplexer MUX,in2. The timing data acquisition device 4 may be used to measure the clock-to-delay of the semiconductor device by dualizing the input of the data path and the clock path. The first input multiplexer MUX,in1 may receive a first signal S1 and a second signal S2 and selectively output one of the received signals. In an example embodiment, the first signal S1 may be a predetermined data signal DS and the second signal S2 may be a first external clock signal CLK1. The second input multiplexer MUX,in2 may receive the second signal S2 and a third signal S3 and selectively output one of the received signals. In an example embodiment, the second signal S2 may be the first external clock signal CLK1 and the third signal S3 may be a second external clock signal CLK2.

The timing data acquisition device 4 may use a first clock-to-delay measured using the first signal S1 and the third signal S3, and a second clock-to-delay measured using the second signal S2, to eliminate set-up time noise of the plurality of respective D flip-flops 30_1 to 30_n. For example, the timing data acquisition device 4 may remove the set-up time noise of the plurality of respective D flip-flops 30_1 to 30_n by subtracting the second clock-to-delay from the first clock-to-delay.

The data signal generator 10 selectively may receive the first signal S1 and the second signal S2 from the first input multiplexer MUX,in1, may generate the first to nth data signals DS1 to DSn as oscillation signals, and may provide the generated signals to the first to nth D flip-flops 30_1 to 30_n, respectively. In an example embodiment, the first through nth data signals DS1 to DSn may be sequentially delayed signals. The data signal generator 10 may include first to nth data signal delay units 140_1 to 140_n constituting a data path. The first to nth data signal delay units 140_1 to 140_n may selectively receive the first signal S1 and the second signal S2 from the first input multiplexer MUX,in1 and may output sequentially-delayed first to nth data signals DS1 to DSn.

The clock signal generator 20 may include first to nth clock signal delay units 240_1 to 240_n constituting a clock path. The first to nth clock signal delay units 240_1 to 240_n selectively receive the second signal S2 and the third signal S3 from the second input multiplexer MUX,in2 and sequentially delay the first to nth clock signal delay units 240_1 to 240_n. The first to nth clock signals CLK1_CLKn may be output.

Each of the first to nth data signal delay units 140_1 to 140_n may include 2n inverters (where n is a natural number). In addition, each of the first to nth clock signal delay units 240_1 to 240_n may include 2×(n+1) inverters. The difference in the number of inverters between each data signal delay unit 140_1 to 140_n and each clock signal delay unit 240_1 to 240_n may be two or more, and the timing skew may be two or more times the real delay of each inverter.

In an example embodiment, to significantly reduce timing skew to collect more accurate timing data, the timing data acquisition device 4 may control operating power of the data signal generator 10 including the data path, the clock signal generator 20 including the clock path, and the plurality of D flip-flops 30_1 to 30_n, to have different levels. For example, when the level of the operating power of the plurality of D flip-flops 30_1 to 30_n is a first level, the timing data acquisition device 4 controls the level of the operating power of the data signal generator 10 to have a second level, lower than the first level, and controls the level of the operating power of the clock signal generator 20 to have a third level, higher than the first level. As the data signal generator 10 operates at a second level, lower than the first level, the timing of each of the first through nth data signals DS1 to DSn output from the data signal generator 10 may be slowed down. In addition, as the clock signal generator 20 operates at the third level higher than the first level, timing of each of the first to nth clock signals CLK1 to CLKn output from the clock signal generator 20 may be relatively fast. As a result, the interval between adjacent edges of respective data signals DS1 to DSn and corresponding clock signals CLK1 to CLKn is narrowed. Thus, the magnitude of the timing skew may be reduced to twice the real delay of each inverter, or lower, and the timing data acquisition device 4 may measure a clock-to-delay more accurately.

To control the operating power of the data signal generator 10, the clock signal generator 20, and the plurality of D flip-flops 30_1 to 30_n, for example, the levels of the output voltages differently, the timing data acquisition device 4 may include first to nth level-down shifters LDS1 to LDSn connected to output terminals for the first to nth data signals DS1 to DSn, respectively, and first to nth level-up shifters LUS1 to LUSn to output terminals for the first to nth clock signals CK1 to CKn, respectively.

In addition, to eliminate the delay caused by the first to nth level-up shifters LUS1 to LUSn and the first to nth level-down shifters LDS1 to LDSn, the timing data acquisition device 4 may include an input level-up shifter LUSi and an input level-down shifter LDSi. Since the delay values due to the input level-up shifter LUSi and the first to nth level-down shifters LDS1 to LDSn respectively are the same as the delay values generated by the input level-down shifter LDSi and the first to nth level-up shifters LUS1 to LUSn respectively, the delays generated by the first to nth level-up shifters LUS1 to LUSn and the first to nth level-down shifters LDS1 to LDSn may be offset from each other in a timing data collection process.

The input level-up shifter LUSi may be connected to an external clock signal CLK input terminal of the multiplexer 110 of the data signal generator 10 to increase the level of the respective input signal at the same scale as the first to nth level-up shifters LUS1 to LUSn. The input level-down shifter LDSi may be connected to an external clock signal CLK input terminal of the multiplexer 210 of the clock signal generator 20 to lower the level of the respective input signal at the same scale as the first to nth level-down shifters LDS1 to LDSn.

In an example embodiment, the magnitude of the timing skew may be changed by adjusting the scale values of the first to nth level-down shifters LDS1 to LDSn and the scale values of the first to nth level-up shifters LUS1 to LUSn. For example, by increasing the level difference between the data signals DS1 to DSn and the clock signals CLK1 to CLKn input to the first through nth D flip-flops 30_1 to 30_n, the magnitude of the timing skew may be further reduced.

Figure 13:
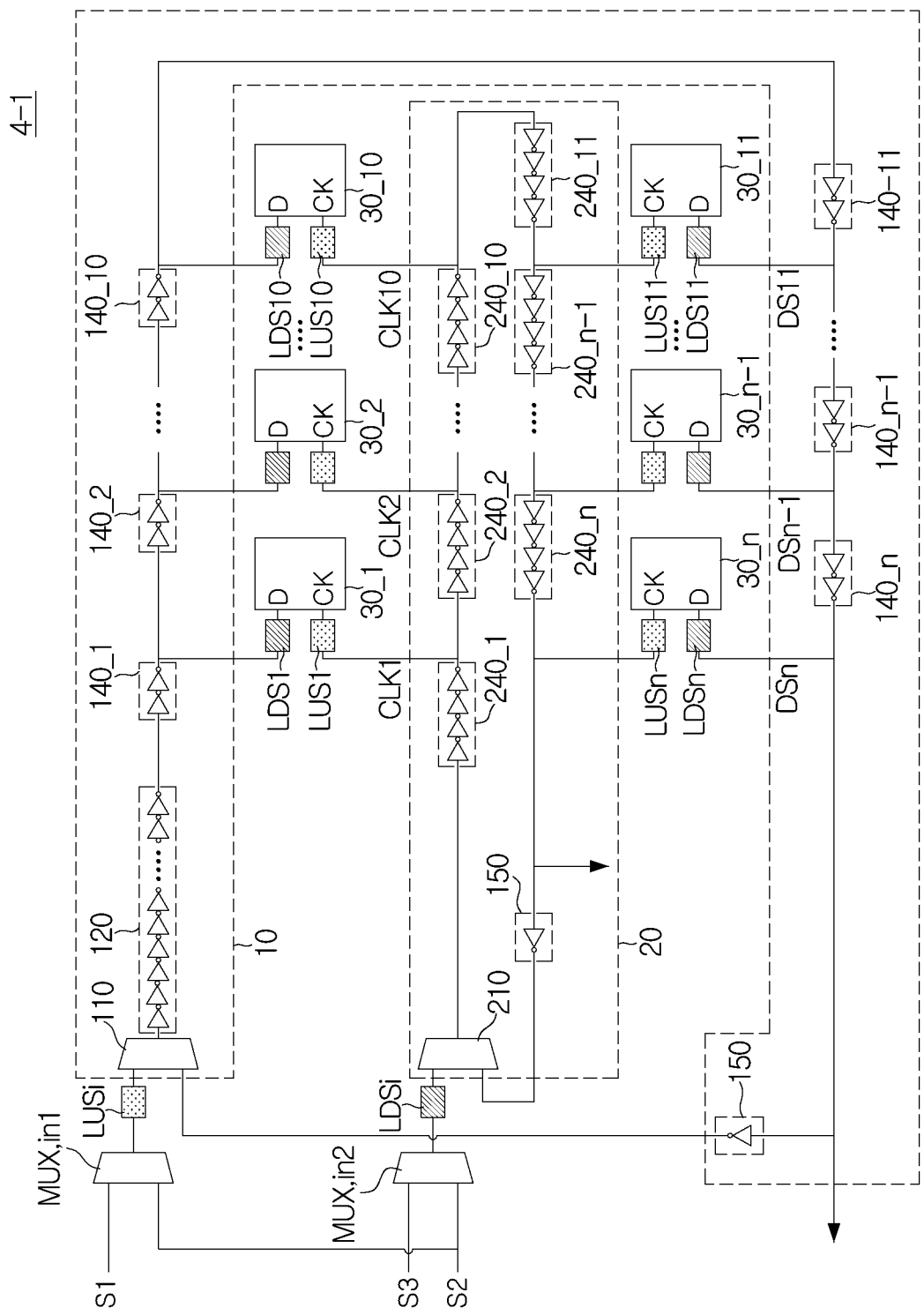
FIG. 13 is a circuit diagram illustrating an example of the timing data acquisition device of FIG. 12 in consideration of arrangement of a plurality of D flip-flops.

FIG. 13 is a circuit diagram illustrating an example of the timing data acquisition device of FIG. 12 in consideration of arrangement of a plurality of D flip-flops. Referring to FIG. 13, a timing data acquisition device 4_1 may include a data signal generator 10, a clock signal generator 20, a plurality of D flip-flops 30_1 to 30_n, a first input multiplexer MUX, in1, and a second input multiplexer MUX,in2.

The plurality of D flip-flops 30_1 to 30_n may be disposed on two or more parallel lines as described above with reference to FIG. 4. For example, first to tenth D flip-flops 30_1 to 30_10 may be sequentially disposed on the first line, and eleventh to nth D flip-flops 30_11 to 30_n may be sequentially arranged on one second line parallel to the first line. As such, by distributing the plurality of D flip-flops 30_1 to 30_n on two or more parallel lines rather than in line on one line, the metal line length of the feedback loop may be significantly reduced. In addition, in this case, by significantly reducing a real delay of each inverter included in the data signal generator 10 and the clock signal generator 20, the timing data acquisition device 3_1 may collect more accurate timing data in the unit of ps. On the other hand, although FIG. 13 illustrates that the plurality of D flip-flops 30_1 to 30_n are sequentially disposed on two parallel lines by being merely illustrative, embodiments thereof are not limited thereto. For example, the plurality of D flip-flops 30_1 to 30_n may be sequentially arranged on three parallel lines.

As set forth above, a timing data acquisition device according to example embodiments may collect timing data more accurately by calculating a real delay of an inverter chain and using the calculated delay value.

In addition, in the timing data acquisition device according to example embodiments, by disposing a plurality of D flip-flops on lines parallel to each other, a metal line length of a feedback loop may be significantly reduced, thereby collecting timing data more accurately.

In addition, the timing data acquisition device according to example embodiments may collect timing data more accurately by connecting a level shifter to an input terminal of the D flip-flop to significantly reduce timing skew.

While example embodiments have been illustrated and described above, it will be apparent to those skilled in the art that modifications and variations could be made without departing from the scope of the present inventive concept as defined by the appended claims.

What is claimed is:

1. A timing data acquisition device comprising:
   a data signal generator configured to repeatedly delay an external clock signal, according to a first delay value, to generate a plurality of data signals;
   a clock signal generator configured to repeatedly delay the external clock signal according to a second delay value, greater than the first delay value, to generate a plurality of clock signals; and
   a plurality of D flip-flops configured to receive the plurality of data signals and the plurality of clock signals and generate predetermined output signals,
   wherein a critical point at which a state of the output signals changes is detected, and a difference between delay values of a data signal and a clock signal, corresponding to the critical point, from among the plurality of data signals and the plurality of clock signals, is calculated, to measure at least one of a set-up time and a hold time of a semiconductor device.

2. The timing data acquisition device of claim 1, wherein the plurality of data signals comprise first to Nth data signals sequentially generated, where N is a natural number, and
   the data signal generator comprises a multiplexer selectively outputting any one of the external clock signal and the Nth data signal which is fed back through a first oscillating inverting unit.

3. The timing data acquisition device of claim 2, wherein the data signal generator comprises a plurality of inverters delaying the external clock signal, and
   a delay value of each of the plurality of inverters is calculated using a frequency of the Nth data signal fed back.

4. The timing data acquisition device of claim 1, wherein the plurality of clock signals comprise first to Nth clock signals sequentially generated, where N is a natural number, and
   the clock signal generator comprises a multiplexer selectively outputting one of the external clock signal and the Nth clock signal fed back through a second oscillating inverting unit.

5. The timing data acquisition device of claim 4, wherein the clock signal generator comprises a plurality of inverters delaying the external clock signal, and
   a delay value of each of the plurality of inverters is calculated using a frequency of the Nth clock signal fed back.

6. The timing data acquisition device of claim 1, wherein the plurality of data signals comprise first to Nth data signals sequentially generated, where N is a natural number, and the plurality of clock signals comprise first to Mth clock signals sequentially generated, where M is a natural number, and
   the timing data acquisition device further comprises an output multiplexer selectively outputting one of the Nth data signal and the Mth clock signal to input terminals of the data signal generator and the clock signal generator.

7. The timing data acquisition device of claim 6, wherein the output multiplexer outputs the Nth data signal to generate a first oscillation signal calculating the first delay value.

8. The timing data acquisition device of claim 6, wherein the output multiplexer outputs the Mth clock signal to generate a second oscillation signal calculating the second delay value.

9. The timing data acquisition device of claim 1, wherein the plurality of D flip-flops are sequentially disposed on two or more lines parallel to each other on a plane.

* * * * *